United States Patent [19]
Kamiya

[11] Patent Number: 5,619,129
[45] Date of Patent: Apr. 8, 1997

[54] MULTIMETER HAVING AN ERRONEOUS INPUT PREVENTION MECHANISM

[75] Inventor: Manabu Kamiya, Suwa, Japan

[73] Assignee: Seiko Epson Corporation, Tokyo, Japan

[21] Appl. No.: 588,377

[22] Filed: Jan. 18, 1996

[30] Foreign Application Priority Data

Jan. 19, 1995 [JP] Japan .................................. 7-006672
Dec. 18, 1995 [JP] Japan .................................. 7-329347

[51] Int. Cl.⁶ .................. G08B 21/00; G01R 23/16; G01R 15/12; G01R 1/00
[52] U.S. Cl. .................. 324/115; 324/76.11; 324/110
[58] Field of Search ................. 324/115, 110, 324/76.11; 340/635, 686, 687, 693

[56] References Cited

U.S. PATENT DOCUMENTS

| | | | |
|---|---|---|---|
| 5,166,599 | 11/1992 | Hochreuther et al. | 324/115 |
| 5,243,275 | 9/1993 | Nakazawa et al. | 324/110 |
| 5,442,337 | 8/1995 | Hwang | 324/115 |

FOREIGN PATENT DOCUMENTS

| | | |
|---|---|---|
| 474086A2 | 3/1992 | European Pat. Off. . |
| 507126A2 | 10/1992 | European Pat. Off. . |
| 62-39333 | 10/1987 | Japan . |
| 4-233473 | 8/1992 | Japan . |
| 4-118669 | 10/1992 | Japan . |
| 6-21024 | 6/1994 | Japan . |

*Primary Examiner*—Ernest F. Karlsen
*Assistant Examiner*—Barry C. Bowser
*Attorney, Agent, or Firm*—Oliff & Berridge

[57] ABSTRACT

A multimeter is provided having an erroneous input prevention mechanism that allows more than one mode to be assigned to an input terminal hole located in a central section of a shutter board based on movement of a rotary switch. When the rotary switch is rotated, the first and the second drive-side protrusions formed at separate locations from the selector push away the first or second slave-side protrusions in the slave shell to rotate the shutter board about the center at the negative common terminal hole. Thus, only a specific terminal hole is in the open state. Even when the rotary switch is rotated to a predetermined position, the shutter board does not rotate to leaving the first input terminal hole in the open state.

20 Claims, 17 Drawing Sheets

MULTIMETER HAVING AN ERRONEOUS INPUT PREVENTION MECHANISM

BACKGROUND OF THE INVENTION

1. Field of the Invention

The present invention relates to a multimeter having an erroneous input prevention mechanism including a shutter board. More particularly, the present invention relates to a driving mechanism for a shutter board. The present invention also relates to a positional structure of an input terminal in which a test lead is plugged into a multimeter having an erroneous input prevention mechanism.

2. Description of Related Art

In a multimeter capable of measuring voltage and electric current, a negative common terminal hole and a positive input terminal hole are provided in addition to a separate input terminal hole: for measuring resistance values. In such a multimeter, a test lead pin plug is plugged into the appropriate input terminal hole corresponding to measurement mode and range selected based on switching of the rotary switch. However, if measurement is taken with the pin plug plugged into the input terminal hole for measurement of a small current while the rotary switch is set for a large current range, an internal circuit of the multimeter may be damaged.

Japanese Laid-Open Patent Publication Hei 4-233473, the subject matter of which is incorporated herein by reference, provides a multimeter having an erroneous input prevention mechanism. In this multimeter as shown in FIG. 20, a shutter board 105 is provided with a hole 104 formed for the first input terminal hole 101, the second input terminal hole 102 and the third input terminal hole 103. A stud 107 is also provided between the shutter board 105 and the rotary switch 106. The stud 107 rotates with the rotary switch 106 as one unit and engages with the fork-shaped teeth 108 of the shutter board 105 so that each time the rotary switch 106 rotates, the shutter board 105 also rotates. This causes the hole 104 to match one of the first, second and third input terminal holes 101, 102, 103. Hence, if the second input terminal hole 102 is in an open state corresponding to the setting of rotary switch 106, the first and third input terminal holes 101, 103 are in an interrupted state. This makes it impossible for the pin plug of a test lead to be accidentally plugged into holes other than the second input terminal hole 102. The negative common terminal hole 109 is positioned outside of the range of rotation (dotted line L10) of the shutter board 105.

However, the multimeter having an erroneous input prevention mechanism 100 described above with respect to FIG. 20 has the several problems.

In many cases a multimeter is capable of coping with more than one measurement mode using one input terminal hole. Hence, even in a conventional multimeter 100, the first input terminal hole 101 is left in the open state once the stud 107 disengages from the fork-shaped teeth 108 of the shutter board 105 in the direction specified by the arrow T because the shutter board 105 does not rotate any further. However, the conventional multimeter 100 is designed to utilize disengagement of the stud 107 from the fork-shaped teeth 108. Hence, a problem of little design freedom arises such that only the first and third input terminal holes 101, 103 can be assigned more than one mode while the second input terminal hole 102 cannot be assigned plural modes.

Moreover, the multimeter 100 described in FIG. 20 always leaves the negative common terminal hole 109 in the open state by forming the negative common terminal hole 109 at a location far away from the rotational range of the shutter board 105. Hence, there is little design freedom in terms of size and range of rotation of the shutter board 105. This creates a problem in that the multimeter 100 cannot be miniaturized due to the accommodation of the negative common terminal hole 109 located far away from the range of rotation of the shutter board 105.

Moreover, the multimeter 100 described in FIG. 20 is structured such that the input terminal hole 109 is selected to be in the open state only by the hole 104 of the shutter board 105. This causes each input terminal hole to be arranged on the locus of the hole, which is a restriction. Hence, there is little freedom in changing the position of the input terminal hole.

SUMMARY OF THE INVENTION

It is an object of the present invention to provide a multimeter having an erroneous input prevention mechanism that increases the design freedom by enabling assignment of more than one mode to an input terminal hole located in the middle of a plurality of input terminal holes while still providing an erroneous input prevention mechanism.

It is a further object of the present invention to provide a multimeter having an erroneous input prevention mechanism that increases the design freedom by easing restrictions on the size and range of rotation of the shutter board by enabling placement of the common terminal hole in the range of the rotation of the shutter board. The present invention may also be capable of miniaturization by the space saved by placing the common terminal hole within the range of the rotation of the shutter board.

It is still yet another object of the present invention to provide a multimeter having an erroneous input prevention mechanism capable of improving usability and design characteristics by increasing design freedom as a result of easing restrictions against the location of the terminal hole by altering the method of opening and closing the terminal hole with the shutter board.

The present invention provides a multimeter having an erroneous input prevention mechanism including a rotary switch to select a measurement function, a common terminal hole to plug a test lead pin plug into and a plurality of selection holes separate from the common terminal hole. A shutter board rotates based on the rotary switch while leaving the common terminal hole in an open state and opening one of the selection terminal holes while interrupting other selection holes. A shutter board driving mechanism drives the rotation of the shutter board by transmitting rotational motion of the rotary switch to the shutter board. The shutter board driving mechanism is provided with at least two connection positions within the range of rotation of the rotary switch to mechanically connect the shutter board and the rotary switch and cause the shutter board to interlockingly rotate with the rotation of the rotary switch. Interrupting positions are provided between the connection positions to interrupt the mechanical connection of the shutter board and rotary switch while keeping the shutter board stopped regardless of the rotation of rotary switch.

When a measurement mode or range is selected by the rotary switch, only the selection terminal hole best fitting the condition becomes the open state. Hence, the pin plug of the test lead is not accidentally plugged into another selection terminal hole. Therefore, no erroneous input occurs for the multimeter that prevents the failure of the multimeter. Moreover, with the rotation of the rotary switch, the shutter board becomes mechanically connected to the rotary switch, the connection becomes interrupted, and again becomes mechanically connected to the rotary switch. Hence, more than one mode can be assigned to the input terminal hole located at the central section resulting in greater design freedom.

A mechanism can be used as the shutter board driving mechanism wherein at least two drive-side protrusions are separated by a predetermined angle transmit the rotational motion of the rotary switch to the shutter board by rotating it with the rotary switch as one unit. The position of the connection position and the interrupting position are defined by the location of drive-side protrusions.

A mechanism can also be used as the driving power transmission mechanism between the shutter board and the drive-side protrusions having a slave member with slave-side protrusions to receive rotational driving power from the drive-side protrusions. In this case the slave member transmits the rotational driving power to the shutter board through the slave-side protrusions.

With such a structure, the selection terminal hole remains in the open state even if the rotary switch is rotated as long as the drive-side protrusions do not push the slave-side protrusions away. Thus, in structuring a multimeter such that the one selection terminal hole possesses more than one function, a complex mechanism is not needed thereby making the multimeter both compact and multi-functional.

The drive-side protrusions are preferably formed on a selector member which is freely interchangeable on the rotary switch.

Thus, the corresponding relationship between operation of the rotary switch and the opening and closing of the selection terminal hole by the shutter board can be altered by interchanging the selector member on which the drive-side protrusions are formed.

A multimeter having an erroneous input prevention mechanism may include a rotary switch to select the measurement function, a common terminal hole that receives a test lead pin plug, a plurality of selection holes separate from the common terminal holes and a shutter board rotating based on rotational operation of the rotary switch while leaving the common terminal hole in the open state and opening one of the selection terminal holes while interrupting other selection holes. The mechanism may further include a shutter board driving mechanism to drive the rotation of the shutter board by transmitting rotational motion from the rotary switch to the shutter board. The shutter board is structured to rotate about the center position of the common terminal hole.

Thus, only the selection terminal hole best fitting the condition becomes the open state and a pin plug of a test lead is not accidentally plugged into other selection terminal holes. Therefore, no erroneous input occurs for the multimeter. Moreover, the shutter board rotates about the center at the common terminal hole which is always left in the open state. Hence, the common terminal hole need not be formed at a location outside of the range of rotation of the shutter board to thereby increase the design freedom by easing restrictions on the size and range of rotation of the shutter board. Furthermore, miniaturization by an amount equivalent to placing the common terminal hole within the range of rotation is achieved.

The plurality of selection terminal holes preferably include first and second selection terminal holes formed at two locations in substantially the same angular direction but different radial distances from the common terminal hole. Thus, the first selection terminal hole becomes an open state by matching holes formed on the shutter board and becomes an interruption state by mismatching the holes. Further, the second selection terminal hole becomes an interruption state by being covered by one of the side edges of the shutter board while becoming the open state by protruding out of the side edge.

Thus, the plurality of selection terminal holes are preferably provided with a third selection terminal hole formed in the angular direction different from the first and the second selection terminal holes with respect to the common terminal hole. The third selection terminal hole is preferably made to be in the interruption state by covering it with the other side edge of the shutter board and made to be in the open state by protruding out of the side edge.

With such a structure, the selection terminal hole can be provided at an arbitrary radial distance from the center of rotation of shutter board where side edges of the shutter board appear and disappear. Therefore, design freedom may be increased by the positioning of the selection terminal hole to improve the usability and design characteristics.

Other objects, advantages and salient features of the present invention will become apparent from the detailed description taken in conjunction with the annexed drawings.

BRIEF DESCRIPTION OF THE DRAWINGS

The detailed description will be described with reference to the following drawings in which like reference numerals refer to like elements and wherein.

DETAILED DESCRIPTION OF PREFERRED EMBODIMENTS

Figure 1:
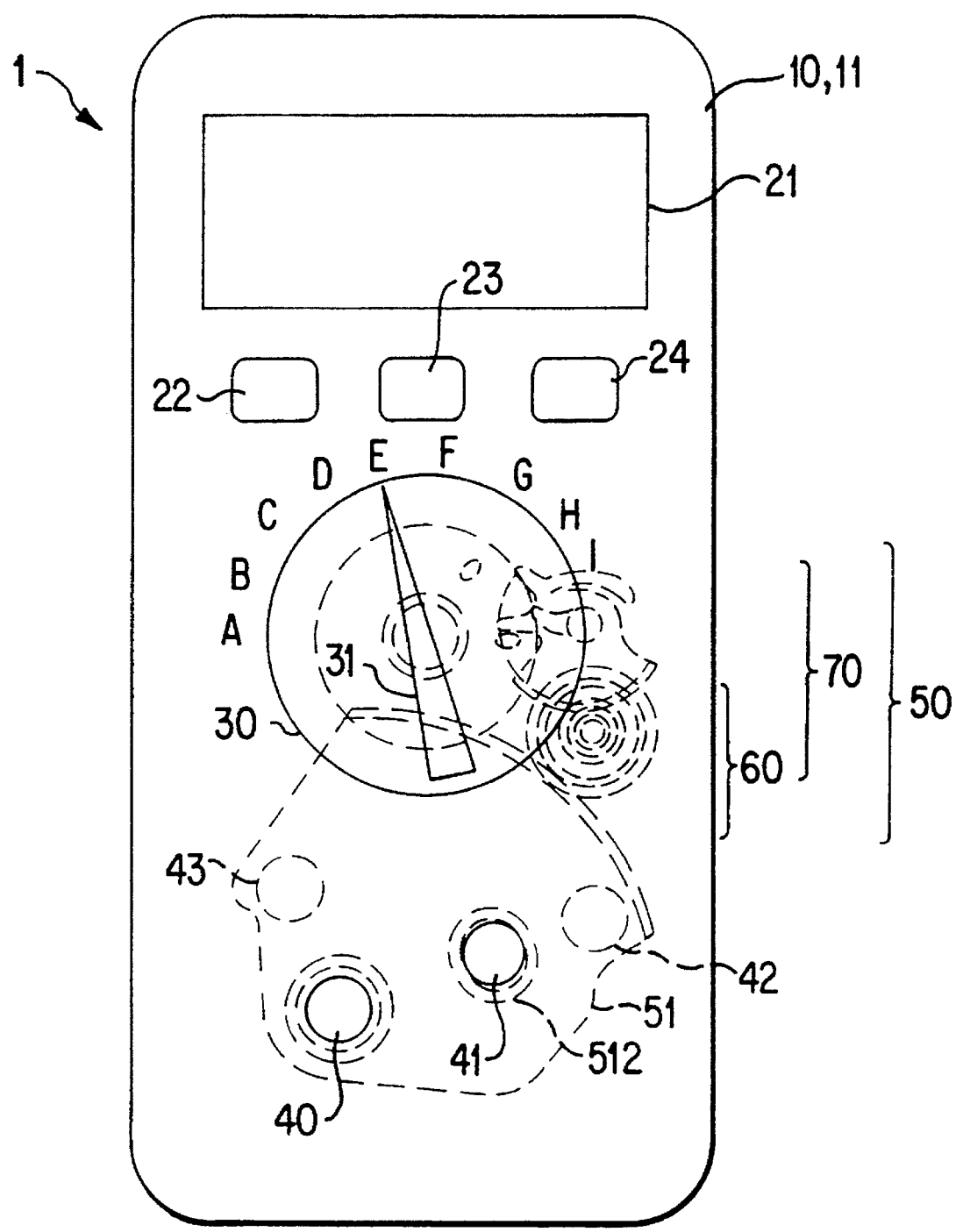
FIG. 1 is a schematic drawing showing an external view of a multimeter having an erroneous input prevention mechanism according to a first embodiment of the present invention.
Figure 2:
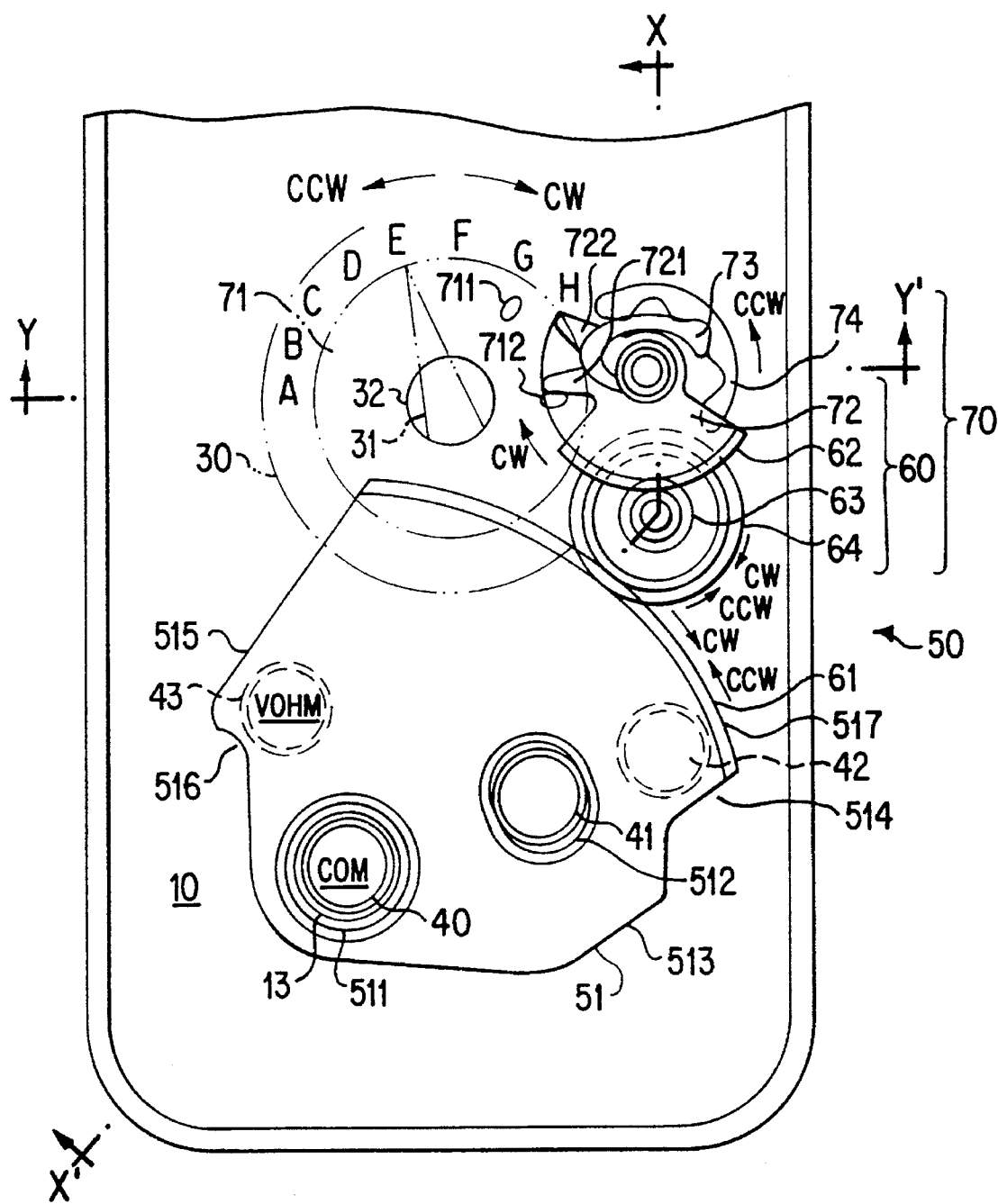
FIG. 2 is a schematic top view showing the erroneous input prevention mechanism of FIG. 1.
Figure 3:
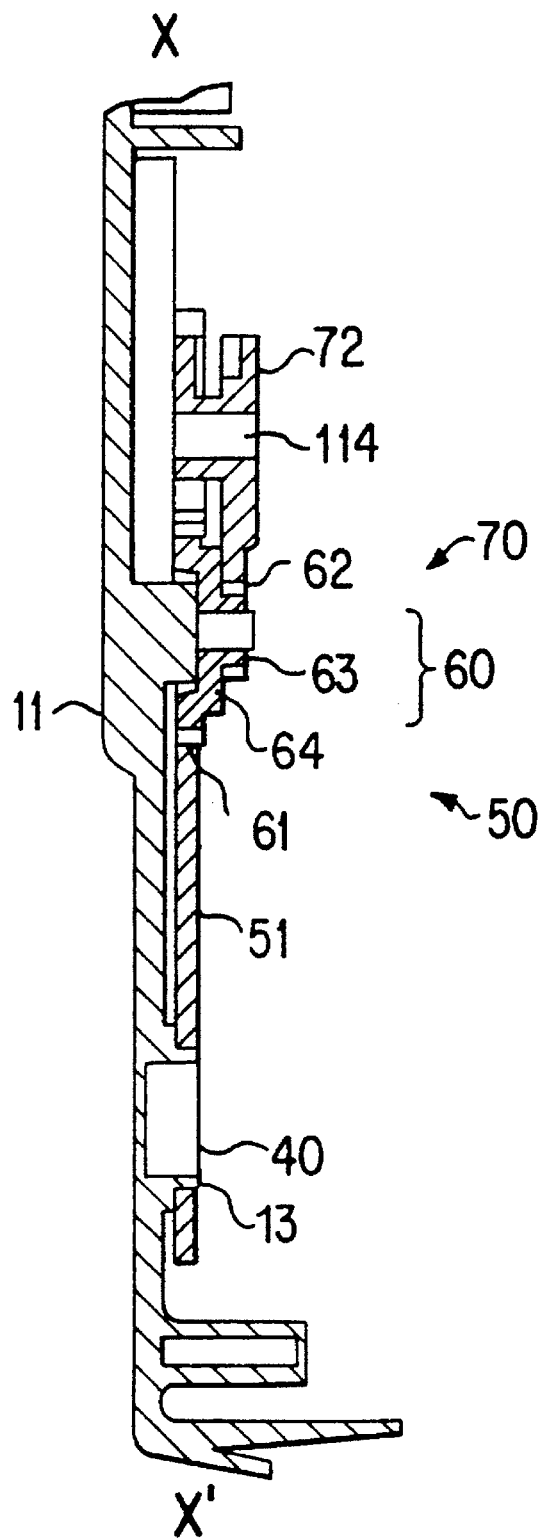
FIG. 3 is a cross section view with respect to line X-X' of FIG. 2.
Figure 4:
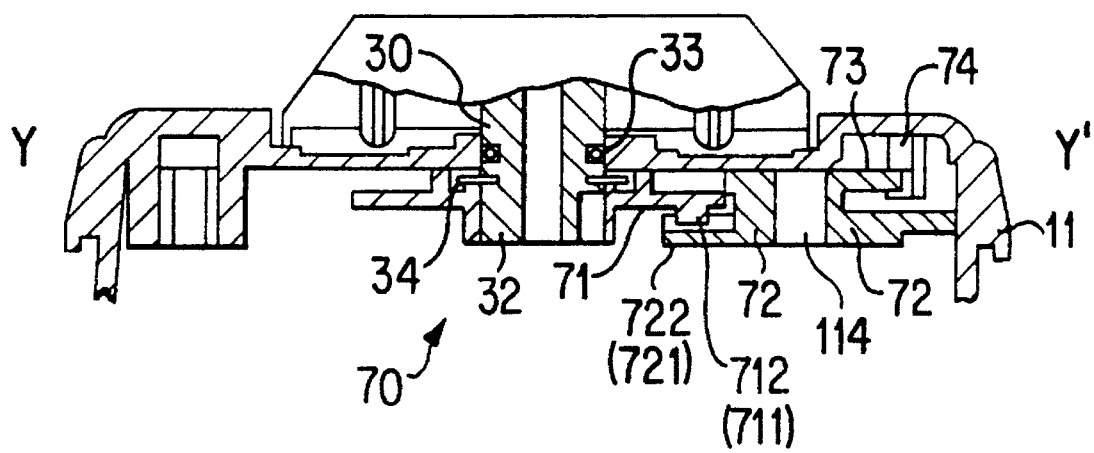
FIG. 4 is a cross section view with respect to line Y-Y' of FIG. 2.

FIG. 1 shows major parts of the internal structure and an external view of the multimeter in a first embodiment. FIG. 2 is a schematic top view showing the structure of the embedded erroneous input prevention mechanism. FIG. 3 is a cross section view with respect to line X-X' of FIG. 2. FIG. 4 is a cross section view with respect to line Y-Y' of FIG. 2.

In FIG. 1, the multimeter having an erroneous input prevention mechanism is a digital multimeter further having a circuit board and battery (not shown) stored inside the resin case 10. The case 10 includes the top case 11 and the bottom case, along with a rectangular display unit 21 made of a liquid crystal display panel and formed towards the top of the top case 11. Three switches 22, 23, 24 are preferably formed below the display unit 21. Each switch is provided with such functions as turning off the power source and holding measurement values.

A rotary switch 30 having a knob 31 similar to an ordinary multimeter is placed in a central section of the case 10. Indices A-I are recorded at equal intervals along the perimeter of the rotary switch 30 to show each measuring mode and range for the multimeter to execute. Indices A-I are selected by pointing the tip of the knob 31 by rotating the rotary switch 30. For example, in FIG. 1 the tip of the knob 31 points to the index E indicating an electric current measuring mode whose range is µA. A stopper mechanism (not shown) is formed with the rotary switch 30 to prevent rotation beyond the predetermined range.

A negative common terminal hole 40 (common terminal hole) is provided on the top surface of the case 10. One of the two test lead pin plugs (not shown) is plugged into the negative common terminal hole 40 when various measurements are performed. A first input terminal hole 41 is formed a predetermined distance away from the negative common terminal hole 40 on the top surface of the case 10 as a positive input terminal hole (selection terminal hole) into which the other test lead pin plug is plugged. This input terminal hole 40 is for electric current measurement with a range µA–mA. A second input terminal hole 42 is also provided on the top surface of the case 10 along a similar angular direction as the first input terminal hole 41 but having a different distance with respect to the negative common terminal hole 40. This input terminal hole is also for electric current measurement like the first input terminal hole 41 but for the range of 10A. A third input terminal hole 43 is provided on the top surface of the case 10 along a different angular direction from the first and second input terminal holes 41 and. 42. This input terminal hole is for voltage measurement and resistance measurements. An appropriate resistance and various measurement circuits are composed in an internal circuit corresponding to these input terminal holes.

When the tip of the knob 31 of the rotary switch 30 is pointed to the index E, an electric current measurement mode is enabled with a range of µA. Hence, if a large electric current is accidentally input under this condition, internal circuits of the multimeter 1 are destroyed, which may be dangerous to users. Hence a erroneous input prevention mechanism 50 is provided in the present embodiment as described below.

A shutter board 51 is placed on the back side of the top case 11 as shown in FIGS. 2 and 3. A round hole 511 and elongated hole 512 are formed on the shutter board 51. The elongated hole 512 is used to receive a pin plug of a test lead and cause the second input terminal hole 41 to be in the open stateas described with respect to FIG. 2. A cylinder section 13 of the top case 11 fits into the round hole 511 which rotates around the negative common terminal hole 40. In this condition, the shutter board 51 is held by the top case 11 and rotates along the back side of the top case 11 with the center of rotation at cylinder section 13 (negative common terminal hole 40).

A notch 514 is formed in one side edge 513 and towards the top of the shutter board 51. The notch 514 opens the second input terminal hole 42 to enable plugging in of the pin plug, which will be described below. Another notch 516 is formed on the other side edge 515 of the shutter board 51 towards the center. The notch 516 opens the third input terminal hole 43 to enable plugging in of the pin plug, which will also be described below. An outer gear 61 is also formed on the tip of the shutter board 51.

A shutter board driving mechanism 70 is formed to mechanically connect the rotary switch 30 and the shutter board 51. A rotation center axis 32 supports the rotary switch 30 and is attached to the top case 11 through a bearing 33 as shown in FIGS. 2 and 4 so as to rotate with the rotary switch 30 as one unit. A disc-shape selector 71, which is freely interchangeable, is attached to the bottom end of the central axis 32 using a stop ring 34 and is made to rotate with the rotary switch 30 as one unit. A connector unit (not shown) is formed in the vicinity of the bottom end part of the rotation center axis 32 to connect with the inner circuits. The rotary switch 30 clicks at every angular position of 20°. Hence, the selector 71 also clicks at every 20° angular position. First and second drive-side protrusions 711, 712 are formed on the bottom surface of the selector 71 at locations deviating 60° from each other around the central axis 32 as shown in FIG. 2. FIG. 4 only shows the second drive-side protrusion 712.

Figure 5:
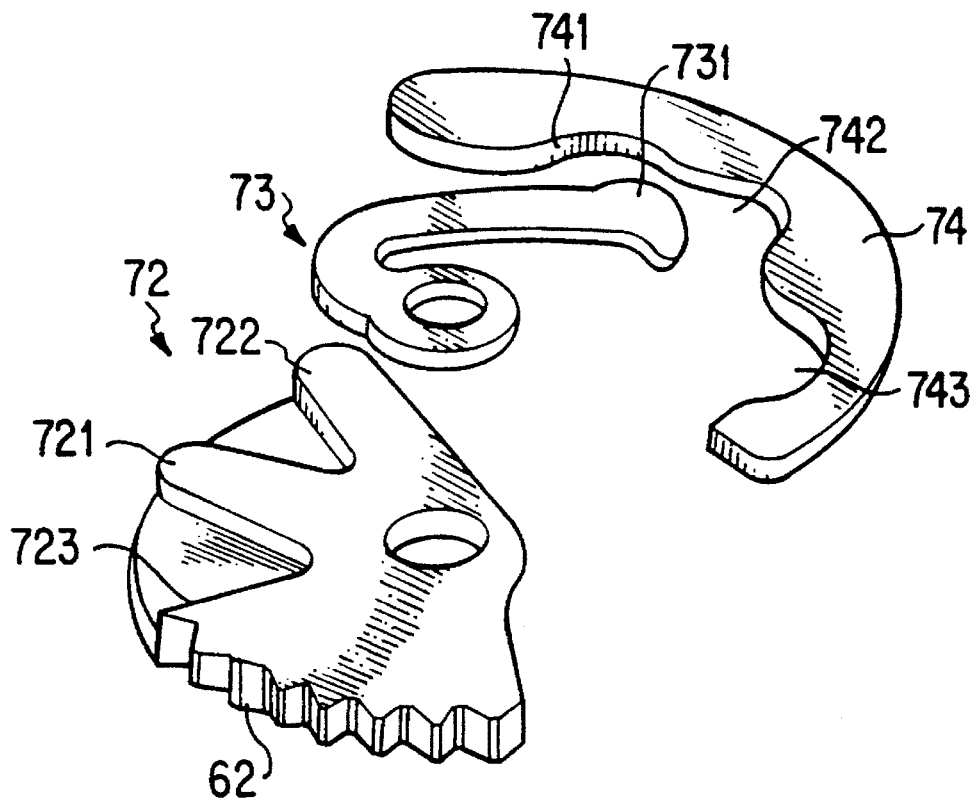
FIG. 5 is an exploded view of an slave wheel used with the erroneous input prevention mechanism of FIG. 1.

A slave wheel 72 (slave member) is provided at the side edge section of the selector 71, free to rotate, about a rotational center axis 114 protruding downward from the top case 11. The slave wheel 72 partially overlaps the selector 71 and is positioned at the bottom side surface. First and second slave-side protrusion 721, 722 protrude towards the outer perimeter at locations deviating by 45° from each other as magnified in FIG. 5. An outer gear 62 is also formed along the outer perimeter section of the fan-shaped main body 723 of the slave wheel 72.

A base of a spring 73 is attached to the central section of the slave wheel 72 as one unit with a tip unit 731 protruding slightly towards the outer perimeter. A receiving board 74 anchored on the top case 11 is positioned outside of the spring 73. First, second and third indentations 741, 742, 743 are formed inside the receiving board 74 at an angular interval of 45°. The tip unit 731 is energized towards the receiving board 74. Hence, during rotation of the slave wheel 72, the tip unit 731 enters inside the second indentation 742 after climbing over from the inside of the first indentation 741 onto a broader section of the second indentation 742. Further, when the selector 71 rotates with the rotary switch 30, the first or second drive-side protrusions 711, 712 push aside the first or second slave-side protrusions 721, 722 while the slave wheel 72, rotating with the selector 71, clicks at every 45° corresponding location where the first through third indentations 741–743 are formed in the receiving board 74.

Referring to FIGS. 2 and 3, a gear mechanism 60 (transmission mechanism) is formed in the shutter board driving mechanism 70 to connect the slave wheel 72 and the shutter board 51. A small gear 63 engages with the outer gear 62 of the slave wheel 72 and a large gear 64 engages with the outer gear 61 of the shutter board 51. In addition, the small gear 63 and the large gear 64 form one unit. Hence, both the small gear 63 and the large gear 64 rotate through the outer gear 62 with a rotation of the slave wheel 72. This rotational motion is transmitted to the shutter board 51 through the outer gear 61.

The operation of multimeter structured in the above manner will now be described.

First, in the condition described in FIG. 2, the tip of the knob 31 of the rotary switch 30 points towards the index E to indicate the electric current measurement mode with a range of μA. In this state, the elongated hole 512 of the shutter board 51 and the first input terminal hole 41 for use in μA–mA range overlap each other. This enables measurement of small electric current by plugging a pin plug of a test lead into the first input terminal hole 41.

Figure 6:
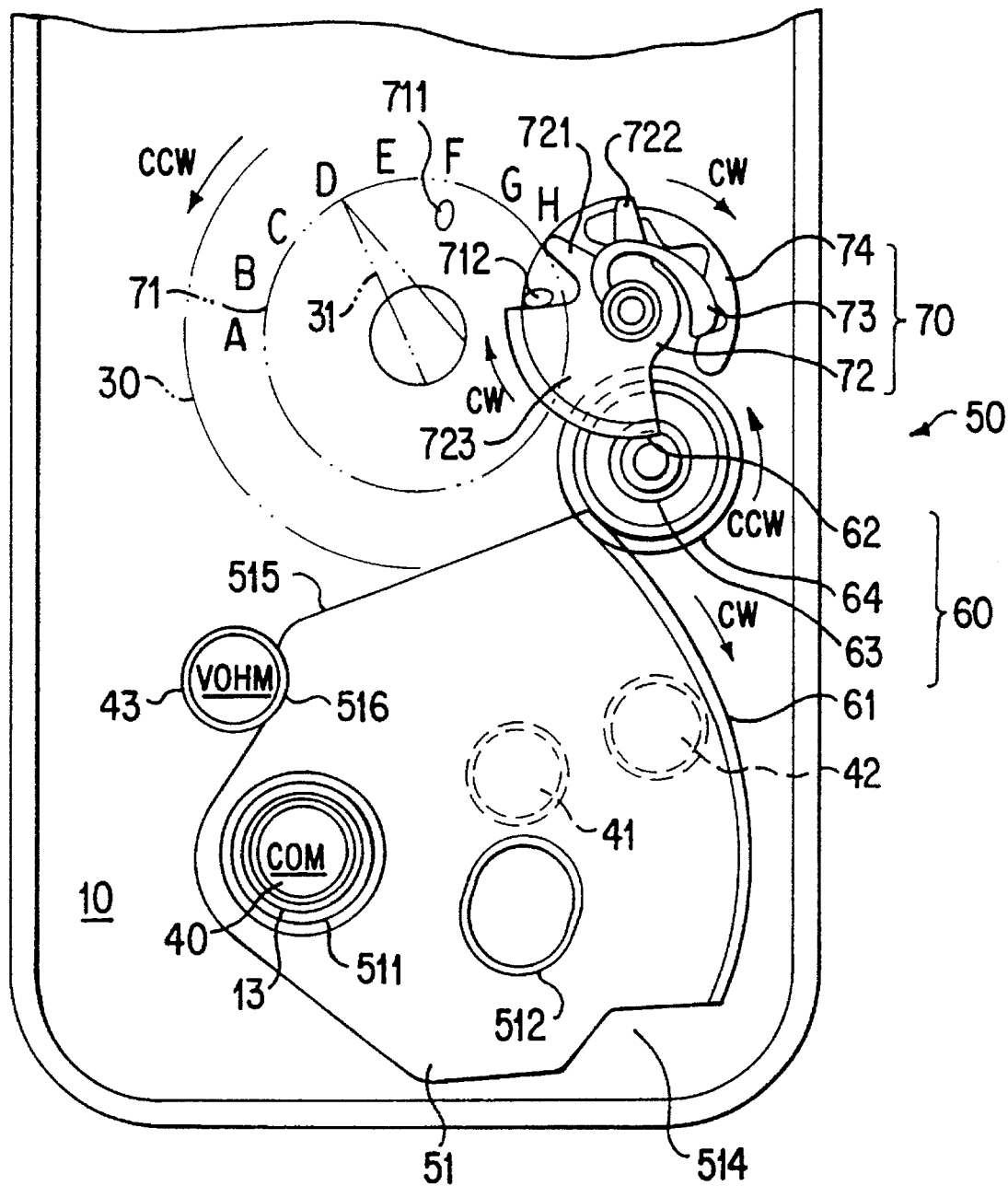
FIG. 6 is a drawing illustrating counterclockwise rotation of a rotary switch from the position of FIG. 2.
Figure 7:
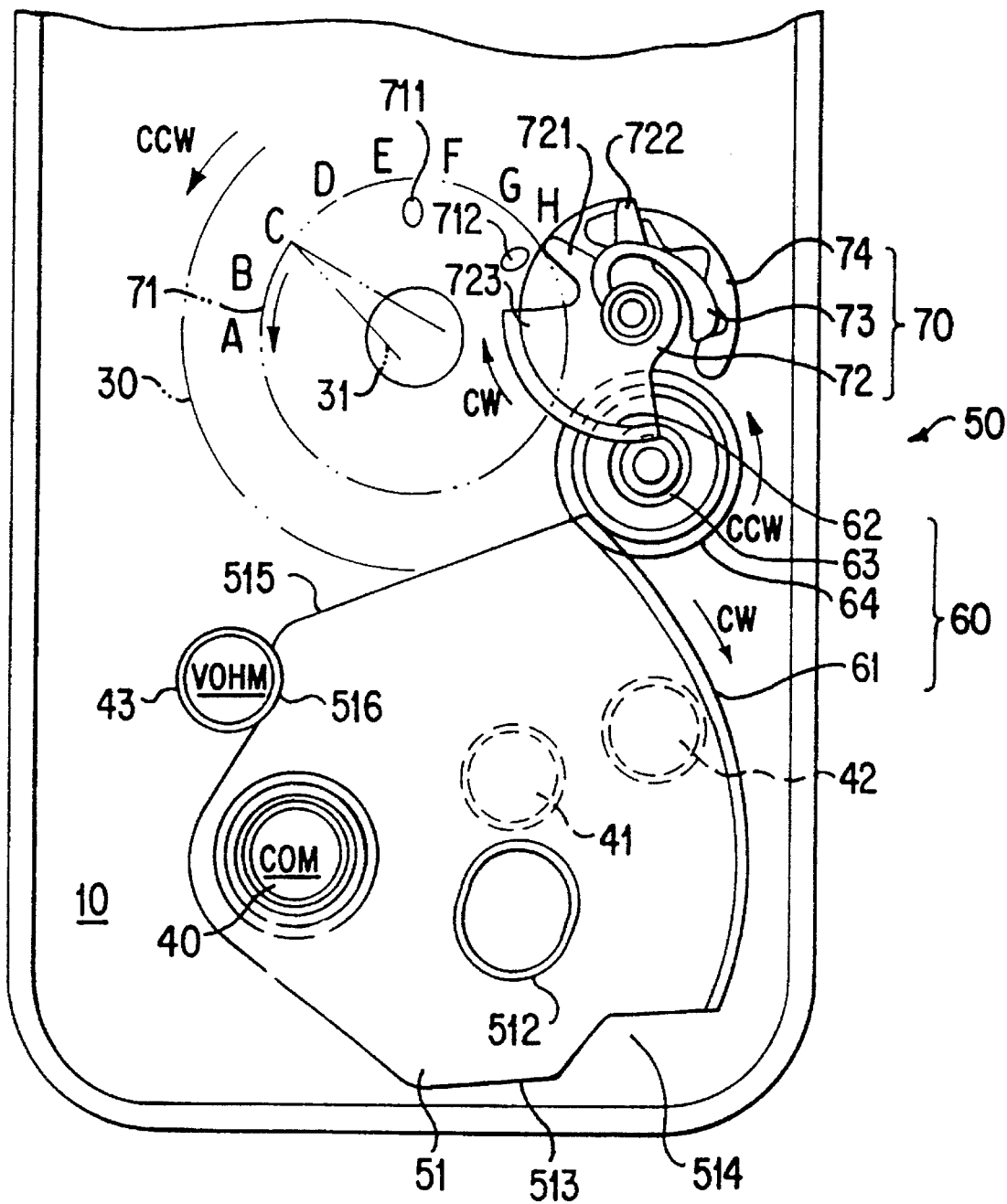
FIG. 7 is a drawing illustrating counterclockwise rotation of a rotary switch from the position of FIG. 5.

The operation of the erroneous input prevention mechanism 50 at the time of switching to direct current voltage measurement mode by rotating the rotary switch 30 20° counterclockwise (direction CCW) from the above position to point the knob 31 towards index D will now be described with reference to FIGS. 2 and 6. First, when the rotary switch 30 is rotated 20° counterclockwise (direction CCW) from the position in FIG. 2, the selector 71 also rotates 20° counterclockwise (direction CCW). Hence, the second drive-side protrusion 712 push the first slave-side protrusion in the clockwise direction (direction CW) and the slave wheel 72 clicks using spring 73 and the receiving board 74 as shown in FIG. 6 to rotate 45° clockwise (direction CW). Due to the rotation of the slave wheel 72, the small gear 63 and the large gear 64 rotate 134.76° counterclockwise (in direction CCW) to rotate the shutter boards 51 35° clockwise (direction CW). As a result, the elongated hole 512 of the shutter board 51 moves away from the location of the first input terminal hole 41 to cause the first input terminal hole 41 to be in an interrupted state relative to the shutter board 51. The second input terminal hole 42 continues to be in an interrupted state. As shown in FIG. 6, the third input terminal hole 43 protrudes from the other side edge section 515 of the shutter board 51 and becomes in an open state because of the notch 516. Hence, the measurement of direct current voltage is enabled by plugging a pin plug of a test lead into the third input terminal hole 43.

An operation of the erroneous input prevention mechanism 50 at the time of switching to alternate current voltage measurement mode by rotating the rotary switch 30 20° counterclockwise (in direction CCW) from this position so as to point the tip of the knob 31 towards index C will now be described with reference to FIG. 6.

First, when the rotary switch 30 is initially rotated 20° counterclockwise (direction CCW) from the position shown in FIG. 6, the selector 71 also rotates 20° counterclockwise (direction CCW). However, the second drive-side protrusion 712 or the first drive-side protrusion 711 do not push aside either the first or second slave-side protrusions 721, 722. Thus, the slave wheel 72 and the shutter board 51 do not rotate. In other words, the third input terminal hole 43 remains in the open state based on the notch 516 and a pin plug of a test lead is left plugged in the third input terminal hole 43 to enable measurement of alternate current voltage.

Hereafter, switching of the tip of the knob 31 successively from index C (alternate current volume frequency measurement mode) to index B (resistance measurement mode) and to index A (temperature measurement mode using a temperature sensor) by rotating rotary switch 30 counterclockwise (direction CCW) by further 20° increments leaves the third input terminal hole 43 in the open state because the slave wheel does not rotate. Thus, various measurements including direct current voltage, alternate current voltage, frequency, resistance and temperature can be performed by providing the negative common terminal hole 40 and the third input terminal hole 43.

The operation of the erroneous input prevention mechanism 50 at the time of switching to electric current measurement mode with a range 1 mA by rotating the rotary switch 30 20° clockwise (direction CW) from the above position to point the knob 31 towards index F will now be described with reference to FIGS. 2 and 8. When the rotary switch 30 is initially rotated 20° clockwise (in direction CW) from the position in FIG. 2, the selector 71 also rotates 20° clockwise (direction CW). However, with the 20° clockwise rotation, the first drive-side protrusion 711 does not push the first slave-side protrusion 721 as described by the real line L1 (the position of the drive-side protrusion) in FIG. 8. Hence, the slave wheel 72 and the shutter board 51 do not rotate. In other words, the elongated hole 512 of the shutter board 51 leaves the first input terminal hole 41 in the open state.

Figure 8:
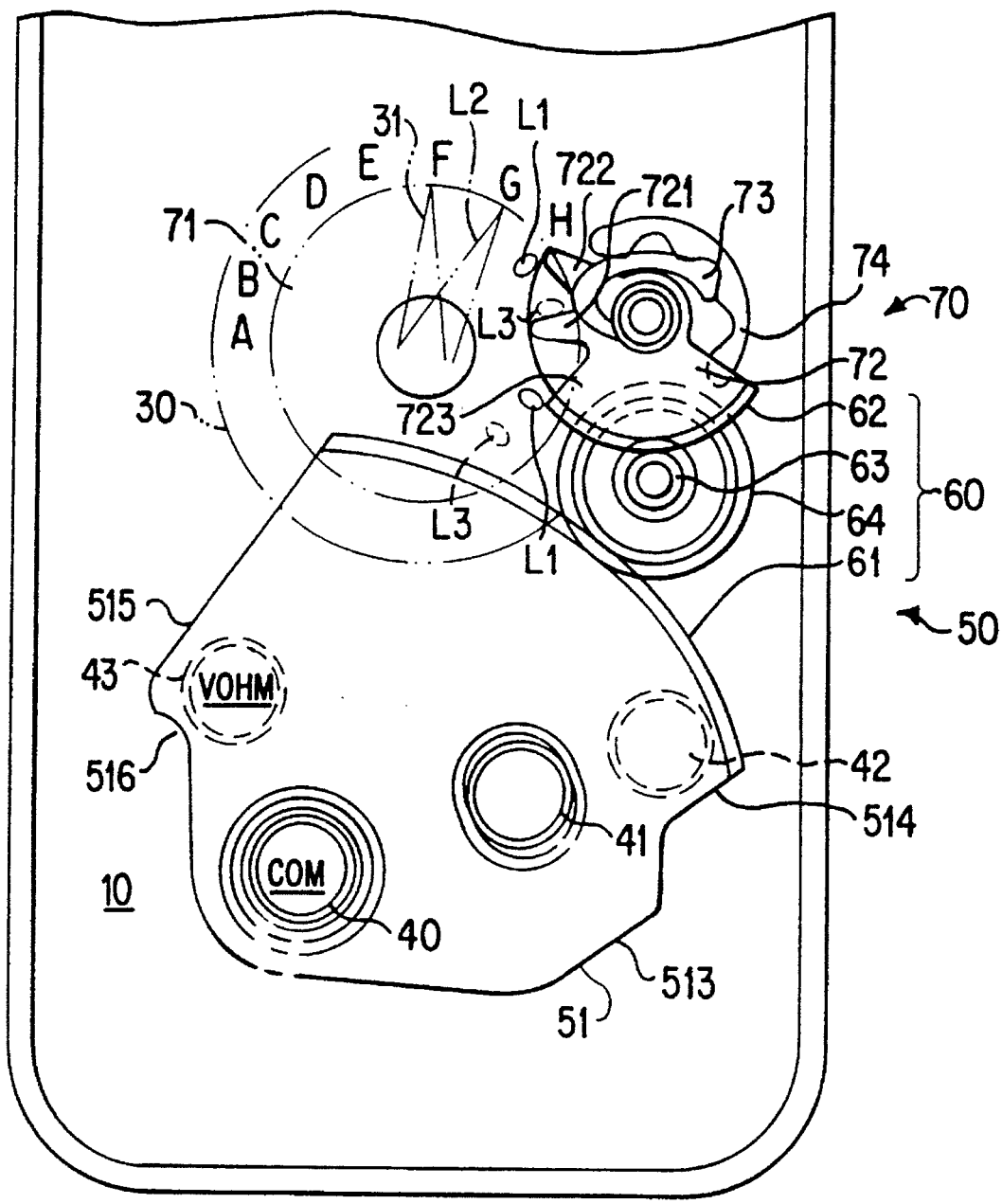
FIG. 8 is a drawing illustrating clockwise rotation of a rotary switch from the position of FIG. 2.

Moreover, even when the knob 31 is further rotated 20° clockwise from the position in FIG. 8 to the position described by the dotted line L2 to point the knob 31 towards the index G so as to switch to electric current measurement mode with a 100 mA range, the first drive-side protrusion 711 does not push the first slave side protrusion 721 as shown by the dotted line L3 (the position of the drive-side protrusion) in FIG. 8. Hence, the slave wheel 72 and the shutter board 51 do not rotate. In other words, the elongated hole 512 of the shutter board 51 leaves the first input terminal hole 41 in the open state.

Hence, with the present embodiment, a wide range of measurements may be performed for a small electric current by using the negative common terminal hole 40 and the first input terminal hole 41.

The operation of the erroneous input prevention mechanism 50 at the time of switching to the electric current measurement mode with the range of 10A by again rotating the rotary switch 30 20° clockwise (direction CW) from the position in FIG. 8 to point the knob 31 towards index H will now be described with reference to FIGS. 8 and 9.

First, when the rotary switch 30 is rotated 20° clockwise (direction CW) from the position in FIG. 8, the selector 71 also rotates 20° clockwise (direction CW). Hence, the first drive-side protrusion 711 rotates 20° clockwise (direction CW) from the position indicated by the dotted line L3 and pushes the first slave-side protrusion 721 in a counterclockwise direction (direction CCW) and the slave wheel 72 clicks by the spring 73 and the receiving board 74 as shown in FIG. 9 and rotates 45° counterclockwise (direction CCW). Due to the rotation of the slave wheel 72, the small gear 63 and the large gear 64 rotate 134.76° clockwise (direction CW) to rotate the shutter board 51 35° counterclockwise (direction CCW). As a result, the elongated hole 512 of the shutter board 51 moves away from the location of the first input terminal hole 41 to cause the first input terminal hole 41 to be in an interrupted state because of the shutter board 51. Moreover, the third input terminal hole 43 is in the interrupted state based on the shutter board 51. On the other hand, the second input terminal hole 42 changes to an open state based on the notch 514 at the other side edge section 513 of the shutter board 51. Thus, measurement of large electric current is enabled by plugging a pin plug of a test lead into the second input terminal hole 42.

Figure 9:
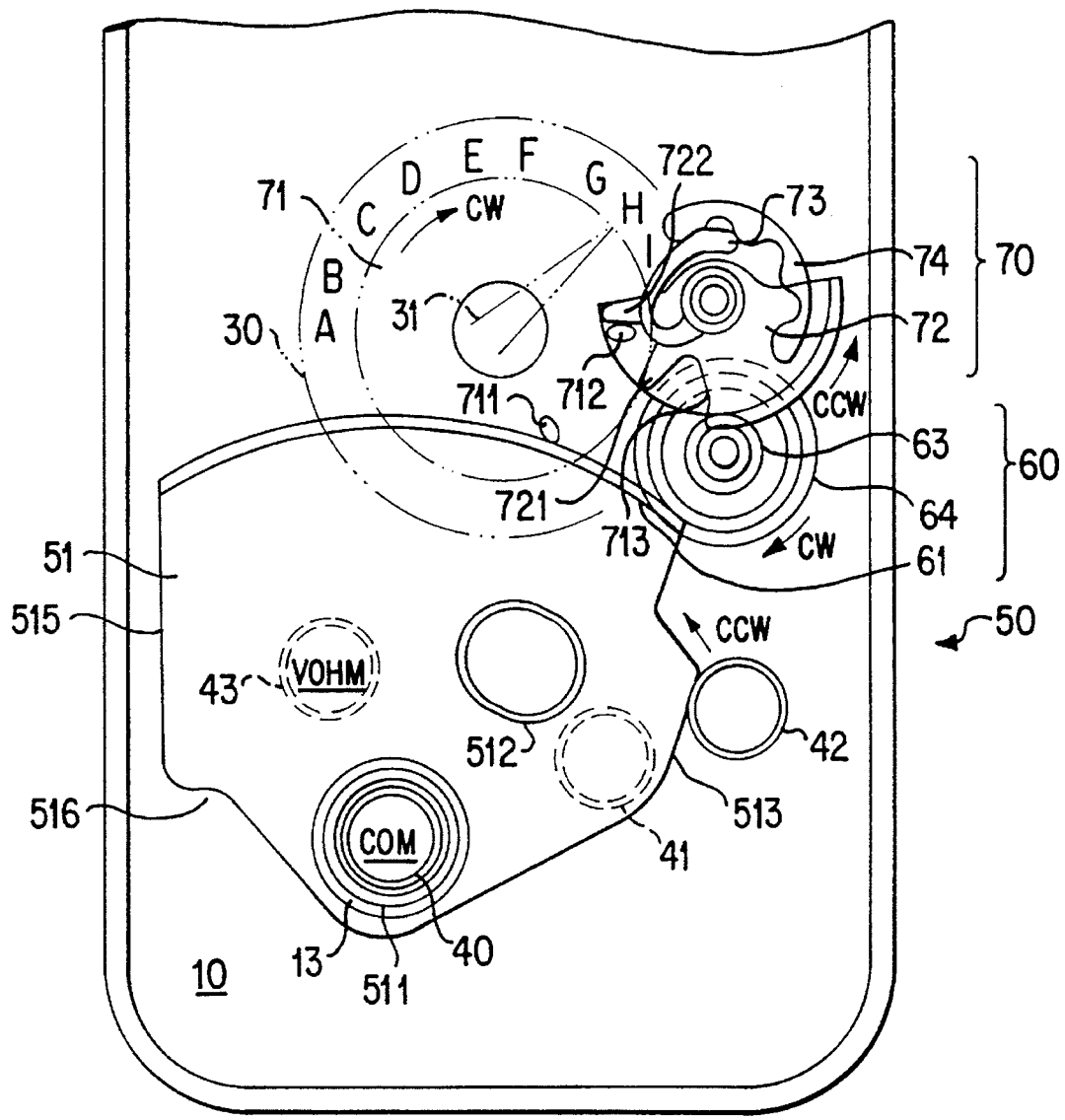
FIG. 9 is a drawing illustrating clockwise rotation of a rotary switch from the position of FIG. 8.

Moreover, even when the knob 31 is further rotated 20° clockwise (direction CW) from the position in FIG. 9 to point the knob 31 towards the index I, the shutter board 51 does not rotate. Thus, the second input terminal hole 42 is left in the open state at the other side edge of the shutter board 51.

The operation of the erroneous input prevention mechanism 50 to switch back to the electric current measurement mode for the 100 mA range by returning the knob 31 to index G by rotating the rotary switch 30 20° counterclockwise (direction CCW) from the position in FIG. 9 is opposite to the above described operation.

In other words, when the rotary switch 30 is rotated 20° counterclockwise (direction CCW) from the position in FIG. 9, the selector 71 also rotates 20° counterclockwise (direction CCW). Hence, the first drive-side protrusion 711 pushes the second slave-side protrusion 722 in the clockwise direction (direction CW) and the slave wheel 72 clicks by spring 73 and the receiving board 74 and rotates 45° clockwise (direction CW). Next, due to the rotation of the slave wheel 72, the small gear 63 and the large gear 64 rotate 134.76° counterclockwise (direction CCw) to rotate the shutter board 51 35° clockwise (direction CW). As a result, the second input terminal hole 42 is interrupted at one side edge section 513 of the shutter board 51. On the other hand, the first input terminal hole 41 returns to an open state based on the elongated hole 512.

As described above, in the multimeter of this embodiment, when the measurement mode and the range is selected by switching the rotary switch 30, only the input terminal hole satisfying the corresponding condition becomes an open state. Hence, accidental plugging in of test lead pin plugs is avoided and erroneous input to the multimeter is avoided. This results in a multimeter having few failures and being safe to use.

Moreover, in the multimeter of the present embodiment, the shutter board driving mechanism 70 is structured such that the first and second slave-side protrusions 721 and 722 formed on the slave wheel 72 are pushed by the first and second drive-side protrusions 711, 712. Hence, depending on the location of these protrusions, even when the rotary switch 30 is rotated, the shutter board does not rotate to cause the same input terminal hole to be in the open state as described above. Thus, it becomes possible to assign more than one function to one input terminal hole while maintaining the erroneous input prevention mechanism operative. Moreover, the first and second drive-side protrusions 711, 712 are provided at locations separated by a predetermined angle. Thus, the shutter board driving mechanism 70 provides connection positions to rotate shutter board 51 and interlocking the rotation of rotary switch 30 by mechanically connecting the shutter board 51 and the rotary switch 30 (the position to point the knob 31 from index D to index E and the position to point the knob 31 from index G to index H) and interrupting positions to stop the shutter board 51 in spite of rotation of rotary switch 30 by interrupting the mechanical connection of the shutter board 51 and the rotary switch 30 (the position to point the knob 31 from index E to index F and the position to point the knob 31 from index F to index G). Hence, design freedom is increased since more than one mode can be assigned to the first input terminal hole 41 positioned substantially at the central section in addition to the second and third input terminal holes 42, 43 positioned substantially at both ends.

Moreover, because the selector 71 is easily interchangeable on the rotary switch 30, the operation of the rotary switch 30 and the opening-closing pattern of the input terminal hole can be easily changed by replacing selector 71 with one having the first and second drive-side protrusions 711, 712 formed at different locations. For example, the third input terminal hole 43 may become the open state when the knob 31 points to indices A, B, C and D, the first input terminal hole 41 may become the open state when the knob 31 points to indices E, F and G, and the second input terminal hole 42 may become the open state when the tip of the knob 31 points to indices H and I. However, the present embodiment can be altered to a structure where the third input terminal hole 43 becomes the open state when the knob 31 points to indices A, B, and C, the first input terminal hole 41 becomes the open state when the knob 31 points to indices D, E, F, G and H, and the second input terminal hole 42 becomes the open state when the knob 31 points to index I by shifting the position of the first drive-side protrusion 711 20° clockwise with respect to the knob 31 and shifting the position of the second drive-side protrusion 712 20° counterclockwise with respect to the knob 31.

Moreover, the shutter board 51 rotates about the center of rotation at the negative common terminal hole 40, which is always in the open state. Hence, the negative common terminal hole 40 need not be formed at a location away from the range of rotation of the shutter board 51. Thus, restrictions on the size and range of rotation of the negative common terminal hole 40 are eased to increase the design freedom. Moreover, miniaturization of the multimeter is also accomplished.

Furthermore, in a conventional multimeter, the input terminal hole is opened and closed based on the holes formed on the shutter board, which restricts the location of the input terminal hole when the shutter board is moved. However, the present embodiment is not restricted to such a locus. In other words, when the second and third input terminal holes 42, 43 are selectively made to become the open state, the input terminal holes protrude from the side edge sections 513, 515. Hence, the second and third input terminal holes 42, 43 can be formed at locations within an arbitrary radius from the negative common terminal hole 40, which is the center of rotation of the shutter board 51, when the location corresponds to the side edge sections 513, 515. Hence, the usability and design characteristics are increased by placing the first input terminal hole 41 and the second input terminal hole 42 close together.

A second embodiment of the present invention will now be described with reference to FIG. 10. In the first embodiment, the drive-side protrusion protruding downwards from the selector 71 and the slave-side protrusion protruding Sideways from the slave wheel 72 transmit the rotation of the rotary switch 30 to the shutter board 51. However, in the second embodiment, rather than using a selector 71, a gear having an outer gear (drive-side protrusion) within a predetermined angle range can be used so that the outer gear of the gear (functioning as a slave member) can receive the rotational motion.

Figure 10:
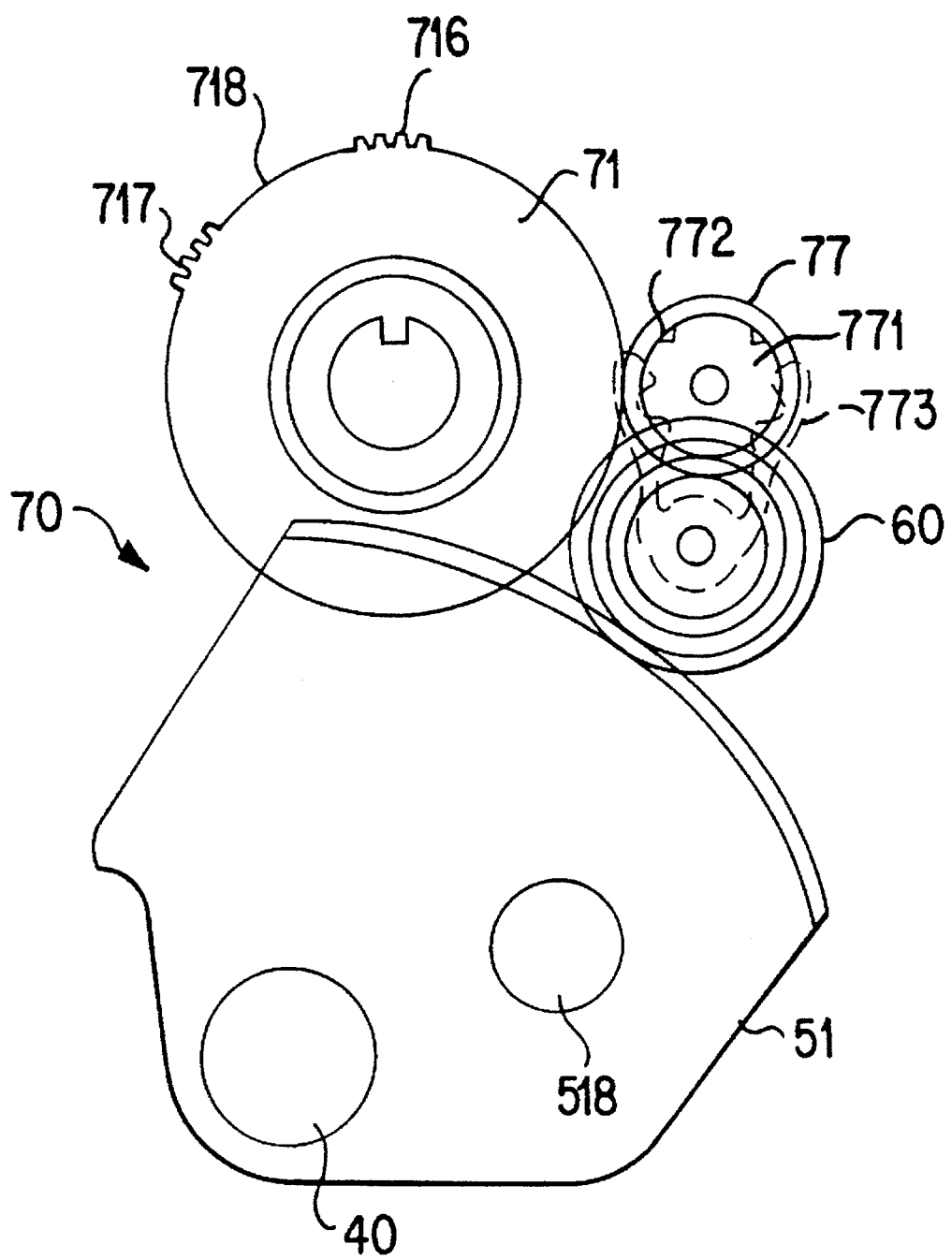
FIG. 10 is a schematic drawing showing a shutter board driving mechanism formed in a multimeter according to a second embodiment of the present invention.

FIG. 10 is a schematic top view describing the structure of the shutter board driving mechanism in this embodiment. The multimeter has a similar structure as the first embodiment.

However, a first outer gear formation region 716 (first drive-side protrusion) is formed on the outer perimeter of the selector 71 which is interchangeable on the rotary switch (not shown) and a second outer gear formation region (second drive-side protrusion) 717 is separated by a predetermined angle from the first outer gear formation region 716. A slave gear 77 (slave member) is located along the side section of the selector 71 and its outer gear (slave-side protrusion) engages with the outer gear formed in the first and the second outer gear formation regions 716, 717 of the selector 71. A plurality of notches are formed at predetermined angle intervals in the disc 771 which is formed as one unit with the slave gear 77. The tip section of the spring 773 fits in these notches to cause the slave gear 77 to click.

With this shutter board driving mechanism, the slave gear 77 and the shutter board 51 are mechanically connected by the gear mechanism 60. Hence, with rotation of the slave gear 77, the shutter board 51 rotates about the center of rotation at the common terminal hole 40 and selects the input terminal hole (not shown) based on the position of the hole 518. Thus, when the measurement mode and range is selected by switching the rotary switch 30, only the input terminal hole satisfying the corresponding condition becomes the open state to avoid an accidental plugging in of the test lead pin plug. This avoids erroneous input to the multimeter and results in a multimeter having few failures and which is safe to use.

Here, the first outer gear formation region 716 and the second outer gears formation region 717 are separated from each other by a predetermined angle range. Hence, the outer gears of the first and second outer gear formation regions 716, 717 engage with the rotary switch and the shutter board 51 is mechanically connected. Therefore the shutter board 51 interlockingly rotates with the rotation of the rotary switch.

On the other hand, if the part facing the slave gear 77 is the part 718 (having no outer gear) located between the first outer gear formation region 716 and the second outer gear formation region 717, the slave gear 77 does not rotate even if the rotary switch is rotated. Hence, the shutter board 51 remains in the position of selecting the same input terminal hole even if the measurement mode and range are changed by the rotary switch. This enables assignment of more than one function to one input terminal hole. Moreover, because the first and second outer gear formation regions 716, 717 are formed in locations separated by a predetermined angle, the shutter board driving mechanism 70 has positions to interrupt mechanical connection of the shutter board 51 and the rotary switch in between the positions where the shutter board 51 and the rotary switch are mechanically connected within the range of rotation of the rotary switch. Hence, this Embodiment increases the design freedom since more than one mode can be assigned to the input terminal hole positioned substantially in the central section in addition to the input terminal hole positioned substantially at both ends based on the rotary switch 30.

Figure 11:
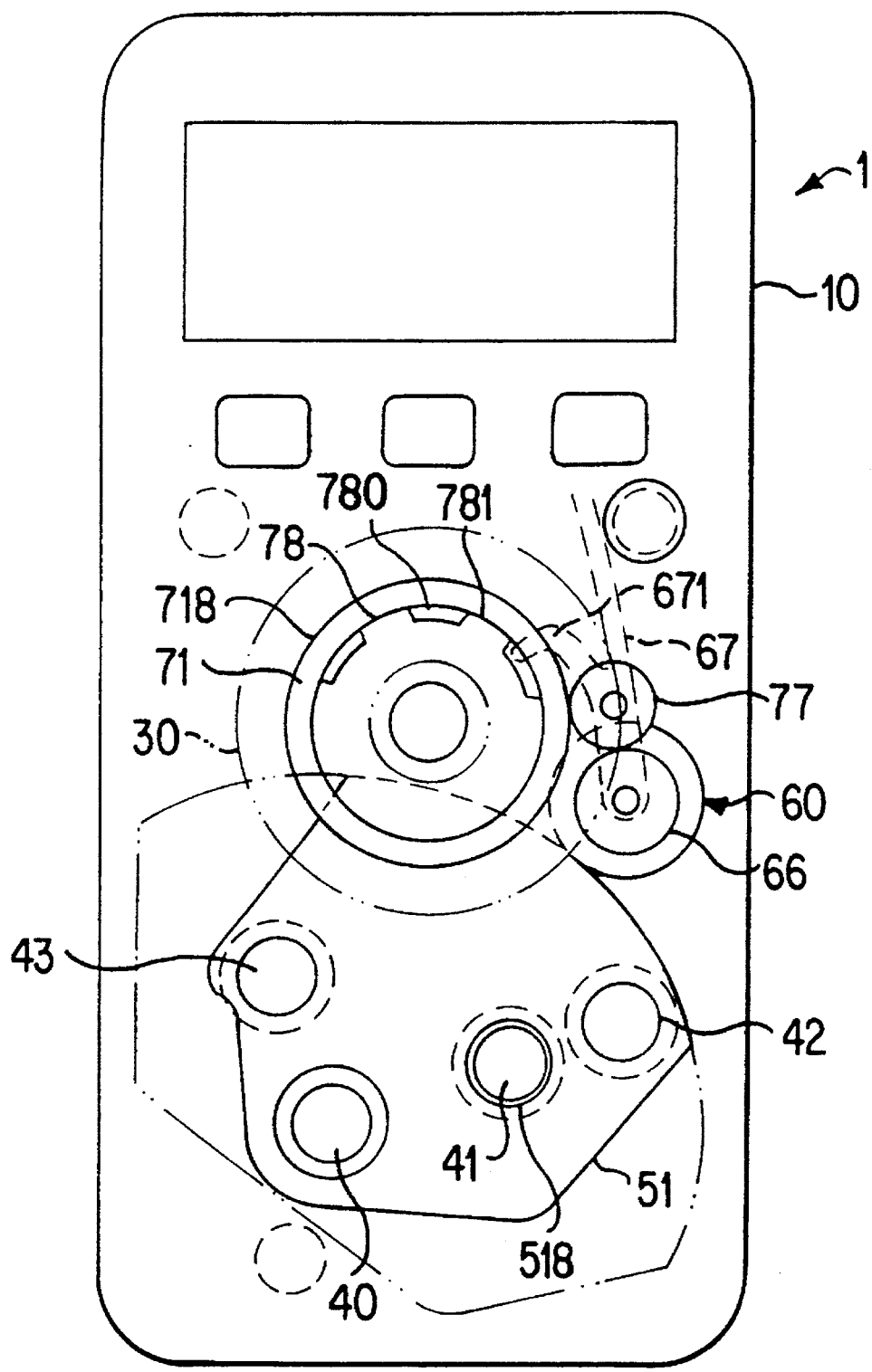
FIG. 11 is a schematic drawing showing a shutter board driving mechanism formed in a multimeter according to a third embodiment of the present invention.

A third embodiment of the present invention will now be described with reference to FIG. 11 showing the structure of the shutter board driving mechanism.

In FIG. 11, an outer gear 718 is formed on the entire outer perimeter of the selector 71 which is interchangeable with the rotary switch 30. A slave gear 77 is located on a side section of the selector 71 with its outer gear engaging the outer gear 718 of the selector 71. Since the slave gear 77 and the shutter board 51 are mechanically connected through the gear mechanism 60, the shutter board 51 rotates about the center at the common terminal hole 40 and selects an input terminal hole from the first, second and third input terminal holes 41–43 based on the location of the hole 518. Hence, when the measurement mode and range is selected using the rotary switch 30, only the input terminal hole satisfying the corresponding condition becomes the open state and an accidental plugging in of a test lead pin plug is avoided.

Here, rotation about the center axis of the slave gear 77 is supported by the spring 67 which is suspended between an inside of the case 10 and the rotation center axis of the gear 66 of the gear mechanism 60. A disc 78 is provided in the selector 71 to form one unit with protrusions 781 formed along the outer perimeter of the disc 78 having a predetermined angle interval. Hence, when the protrusion 671 protruding from the spring 67 is positioned at location 780 (inside indentation) between protrusions 781, the slave gear 77 is at the location closer to the selector 71 where the outer gear 718 and the outer gear of the slave gear 77 mesh each other as shown in FIG. 11. If the rotary switch 30 is rotated, the shutter board 51 also rotates.

On the other hand, if the protrusion 671 of the spring 67 abuts the protrusion 781 of the disc 78, the slave gear 77 is away from the selector 71. Thus, the outer gear 718 of the selector 71 and the outer gear of the slave gear 77 release engagement. Thus, the slave gear 77 does not rotate even if the rotary switch 30 is rotated. The shutter board 51 also does not rotate while the same input terminal hole continues to be in the selected state. Thus, an input terminal hole can have more than one function. Moreover, the protrusions 781 are formed at locations separated by a predetermined angle range. Hence, positions are provided to interrupt the mechanical connection of the shutter board 51 and rotary switch in between the positions where the shutter board 51 and the rotary switch are mechanically connected within the range of angle rotation of the rotary switch. Hence, this embodiment increases the design freedom since more than one mode can be assigned to the first input terminal hole 41 positioned substantially in the central section in addition to the second and third input terminal hole positioned substantially at both ends based on the rotary switch 30.

Figure 12:
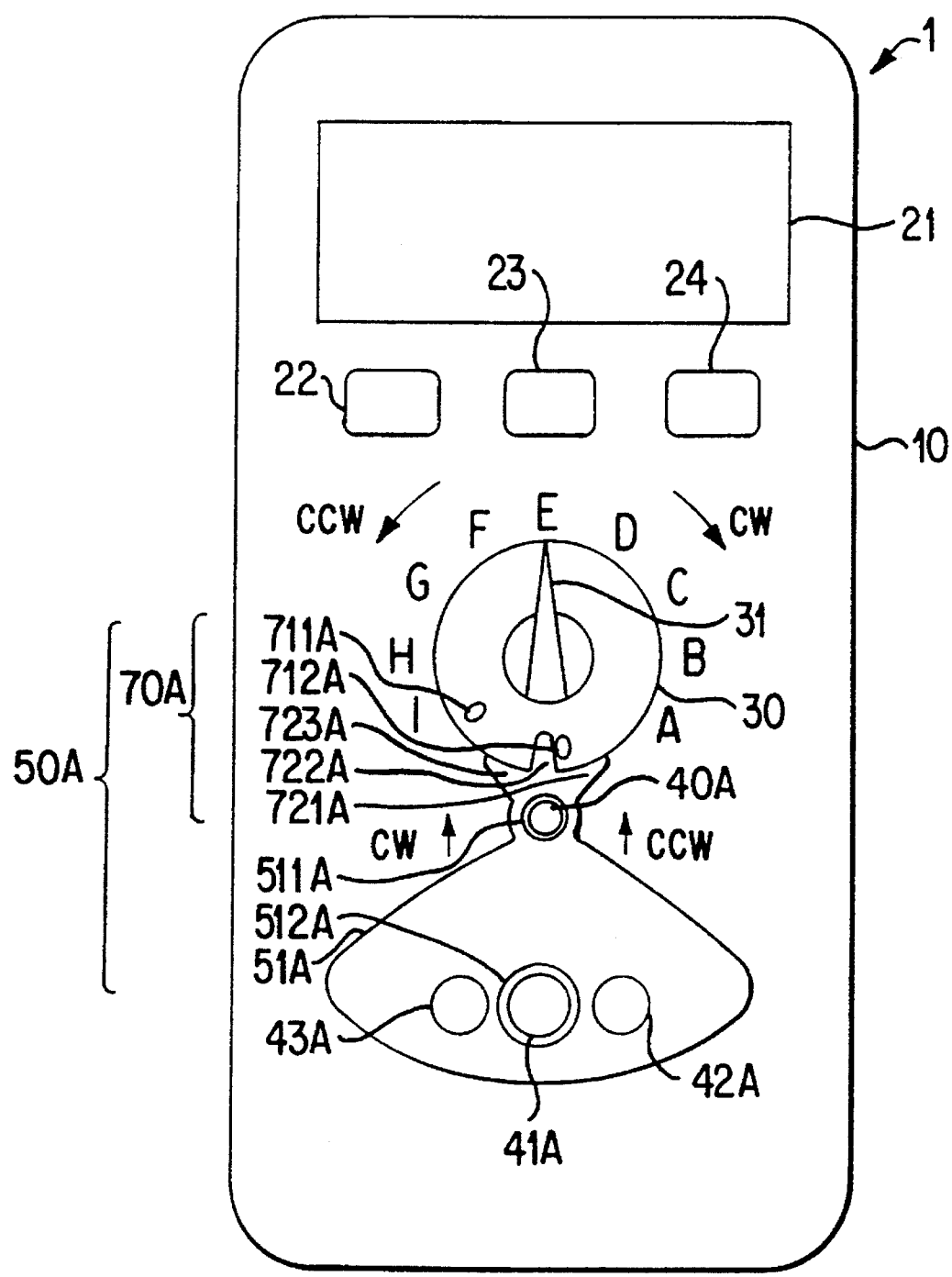
FIG. 12 is a schematic drawing showing a shutter board driving mechanism formed in a multimeter according to a fourth embodiment of the present invention.

A fourth embodiment of the present invention will now be described with reference to FIG. 12 showing a multimeter and structure of an erroneous input prevention mechanism to be mounted on the multimeter. This embodiment differs from the first, second and third embodiments in that it does not have a slave wheel between the rotary switch and shutter board.

In FIG. 12, the multimeter having an erroneous input prevention mechanism includes a digital multimeter and a rotary switch 30 with the knob 31 provided like an ordinary multimeter in a square resin case 10. A rectangular display unit 21 made of a liquid crystal display panel is formed towards the top of the top case 11. Three switches 22, 23, 24 are formed below the display unit 21 with each switch providing such functions as turning off a power source and holding measurement values. Indices A–I recorded at equal intervals along the perimeter of the rotary switch 30 show each measuring mode and range for the multimeter to execute. The indices A–I are selected by pointing the tip of the knob 31 by rotating the rotary switch 30.

A negative common terminal hole 40A (common terminal hole) into which one of the two test lead pin plugs (not shown) is plugged is provided on the top surface of the case 10. First, second and third input terminal holes 41A, 42A, 43A are separated by a predetermined distance from the negative common terminal hole 40A on the top surface of case 10 as positive input terminal holes (selection terminal hole) into which the other test lead pin plug may be plugged. The first input terminal hole 41A in the center is for electric current measurement with a range µA–mA. The second input terminal hole 42A is also for electric current measurement for a 10A range. The third input terminal hole 43A is for voltage and resistance measurements.

With this multimeter, when the tip of the knob 31 of the rotary switch 30 is pointed to the index E, an electric current measurement mode is enabled with a range of µA. Hence, if a large electric current is accidentally input to the multimeter under this condition, internal circuits of the multimeter are destroyed, which may be dangerous to the user. Hence, a erroneous input prevention mechanism 50A is provided as will be described below.

A shutter board 51A is located along the back side of the case 10A relatively large round hole 512A is formed on the shutter board 51A for plugging in a pin plug of a test lead. Another round hole 511A is formed on the shutter board 51A to keep the negative common terminal hole 40A in an open state which becomes the center of rotation of the shutter board 51A.

A shutter board driving mechanism 70A mechanically connects the rotary switch 30 and the shutter board 51A. First and second drive-side protrusions 711A and 712A, separated by a predetermined angle, are formed on the back side of the rotary switch 30 towards an inside of the case 10. Three slave-side protrusions (first, second and third slave-side protrusions 721A–723A) protrude from the shutter board 51A towards the rotary switch 30. The first and second drive-side protrusions 711A, 712A push the first, second and third slave-side protrusions 721A–723A based on rotation of the rotary switch 30 and the shutter board 51A rotates as much as a predetermined angle about the center on which common terminal hole 40A is formed. The shutter board 51A clicks at each predetermined angle using a click mechanism (not shown) embedded in the case 10.

The tip of the knob 31 of the rotary switch 30 points towards the index E to indicate the electric current measurement mode with the range of µA. In this state, the round hole 512A of the shutter board 51A and the first input terminal hole 41A for use in µA–mA range overlap each other. This enables measurement of the small electric current by plugging a pin plug of a test lead into the first input terminal hole 41A.

Figure 13:
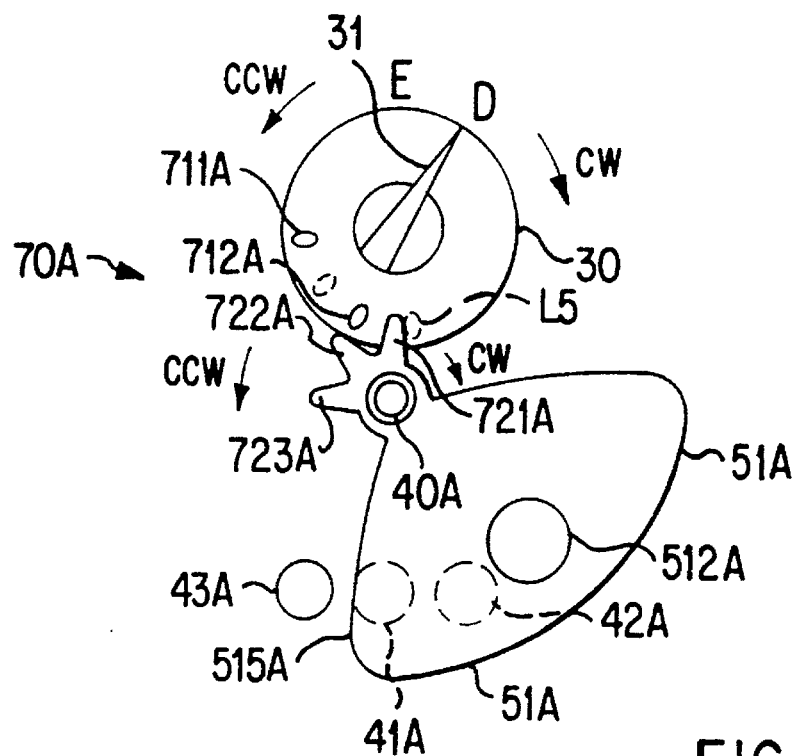
FIG. 13 is a drawing illustrating clockwise rotation of a rotary switch one step from the position of FIG. 12.

When the tip of the knob 31 points to index D from this position after clockwise rotation of the rotary switch 30 by an amount equivalent to one step (direction CW), the second drive-side protrusion 712A pushes the second slave-side protrusion 722A away counterclockwise (direction CCW) as shown in FIG. 13. Hence, the shutter board 51A clicks and rotates counterclockwise (direction CCW) by an amount equivalent to one step. As a result, the round hole 512A in the shutter board 51A moves away from the position of the first input terminal hole 41A to cause the first input terminal hole 41A to be in the interruption state. Moreover, the second input terminal hole remains in an interruption state because of the shutter board 51A. The third input terminal hole 43A protrudes from the side edge section 515A and changes to the open state. Hence, measurement of the direct current voltage becomes possible by plugging a pin plug of a test lead into the third input terminal hole 43A.

Figure 14:
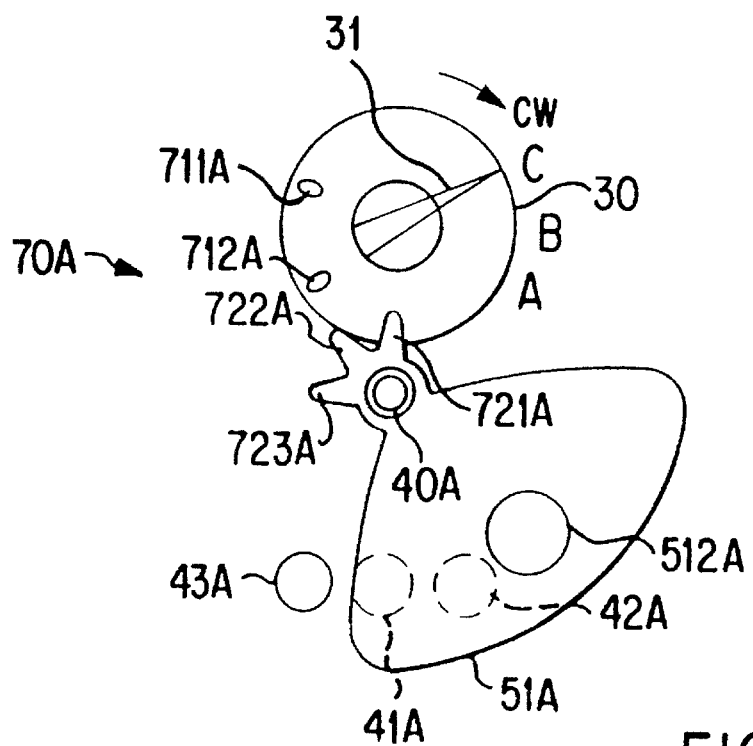
FIG. 14 is a drawing illustrating clockwise rotation of a rotary switch one step from the position of FIG. 13.

When the tip of the knob 31 points to index C from this position after further clockwise rotation of the rotary switch 30 by an amount equivalent to one step clockwise, the shutter board 51A does not further rotate as shown in FIG. 14. Hence, the third input terminal hole remains in the open state at the side edge section of the shutter board 51A to enable the measurement of alternate current voltage with a pin plug of a test lead continuing to be plugged into the third input terminal hole 43A.

Moreover, when the tip of the knob 31 points to index B (resistance measurement mode) and index A (temperature measurement mode using temperature sensor) successively from the position in FIG. 14 after further rotation of the rotary switch 30, the shutter board 51A does not further rotate leaving the third input terminal hole in the open state and enabling various measurements including direct current voltage, alternate current voltage, resistance and temperature using the negative common terminal hole 40A and the third input terminal hole 43A.

Figure 15:
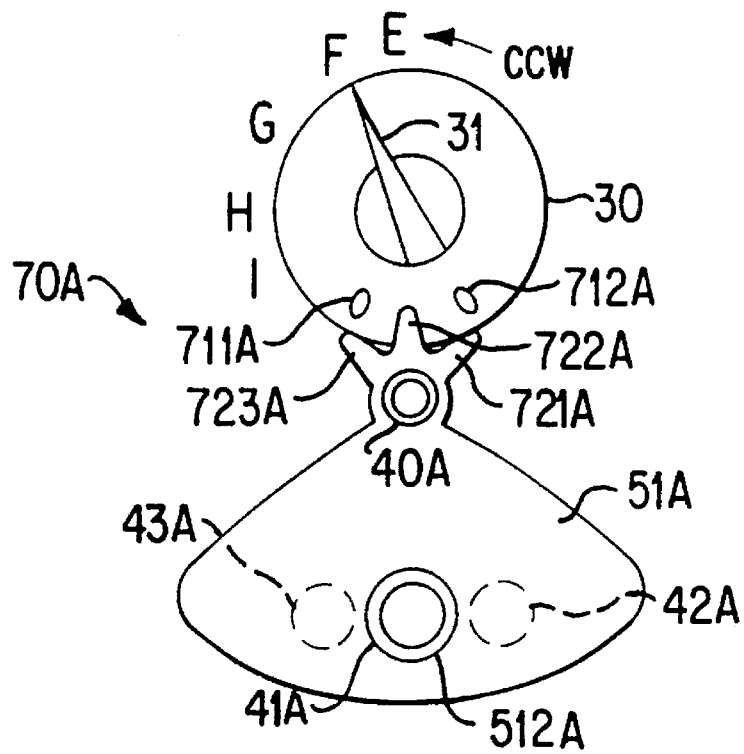
FIG. 15 is a drawing illustrating counterclockwise rotation of a rotary switch one step from the position of FIG. 12.

Next, when the tip of the knob 31 moves from pointing from the position in FIG. 12 to index F after counterclockwise rotation of the rotary switch 30A as shown in FIG. 15, the mode switches to electric current measurement mode with the 1 mA range. However, with this rotation, the first drive-side protrusion 711A does not push the second slave-side protrusion 721A. Hence the shutter board 51A does not rotate and the round hole 512A of the shutter board 51A leaves the first input terminal hole 41A in the open state. Thus, a wide range of electric current measurements are possible using the negative common terminal hole 40A and the first input terminal hole 41A when the current is small.

Figure 16:
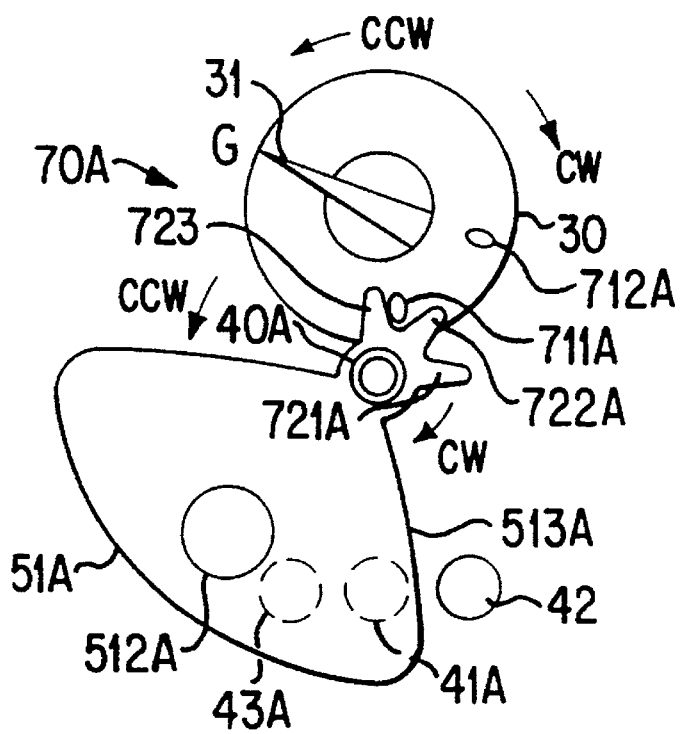
FIG. 16 is a drawing illustrating counterclockwise rotation of a rotary switch one step from the position of FIG. 15.

Next, when the tip of the knob 31 is moved from the position in FIG. 15 to point to index G with further counterclockwise rotation of the rotary switch 30A as shown in FIG. 16, the mode switches to electric current measurement mode with 10A range. Thus, the first drive-side protrusion 711A pushes the second slave-side protrusion 722A clockwise (direction CW) and the shutter board 51A clicks and rotates clockwise by the amount equivalent of one step (direction CW). As a result, the round hole 512A of the shutter board 51A moves away from the position where the first input terminal hole 41A is formed and the second input terminal hole 42A is made to be in an open state at the side edge section 513A of the shutter board 51A replacing the first input terminal hole 41A.

Therefore, the measurement of large electric current is possible by plugging a pin plug of a test lead into the second input terminal hole 42A.

Next, when the knob 31 is moved from the position in FIG. 16 to point to index H and index I successively after further rotation of the rotary switch 30, the shutter board 51A does not rotate leaving the second input terminal hole in the open state.

Moreover, when the tip of the knob 31 is reversed to point to index F after rotation of the rotary switch 30 from the position in FIG. 16 as shown in FIG. 15, the first drive-side protrusion 711A pushes the third slave-side protrusion 723 counterclockwise (direction CCW). Hence, the shutter board 51A clicks and rotates counterclockwise (direction CCW) by an amount equivalent to one step. As a result, the first input terminal hole 41A returns to an open state because of the round hole 512A in the shutter board 51A.

Accordingly, when a measurement mode or range is selected using the rotary switch 30, only the input terminal hole best fitting the condition becomes the open state. Hence, a pin plug of a test lead is not accidentally plugged into another input terminal hole. Therefore, no erroneous input occurs for the multimeter to prevent the failure of the multimeter.

Moreover, with the multimeter of this embodiment, the shutter board 51A does not rotate with the rotation of rotary switch 30 as long as the first and second drive-side protrusions 711A and 712A do not engage with the first, second and third slave-side protrusions 721A–723A. Hence, the same input terminal hole may be in the open state and more than one function can be assigned to one input terminal hole while maintaining the erroneous input prevention mechanism 50A. In addition, because the first and second drive-side protrusions 711A, 712A are placed at locations separated from each other by a predetermined angle, positions are provided to interrupt the mechanical connection of the shutter board 51A and rotary switch 30 so as to keep the shutter board 51A still in spite of rotation of the rotary switch 30 in between the connection positions where the shutter board 51A and the rotary switch 30 are mechanically connected to rotate the shutter board 51A interlocking the rotation of the rotary switch 30 within the range rotation of the rotary switch. Hence, this embodiment increases the design freedom since more than one mode can be assigned to the first input terminal hole 41A positioned substantially in the central section in addition to the second and third input terminal holes 42A, 43A positioned substantially at both ends based on operation of the rotary switch 30.

Moreover, in the multimeter of this embodiment, the shutter board 51A rotates about the center at the negative common terminal hole 40A which is always in the open state. Therefore, the negative common terminal hole 40A is not needed to be formed at a location outside of the range of rotation of the shutter board 51A. Hence, design freedom increases by the amount of easing restriction on the size and range of rotation of the shutter board 51A. Furthermore, miniaturization is achieved by the amount of space saved by not providing the common terminal hole outside the range of rotation.

By forming the first and second drive-side protrusions 711A, 712A in a selector board which is easily interchangeable on the rotary-switch 30, the operation of the rotary switch 30 and the opening-closing pattern of the input terminal hole can be easily changed by replacing selector board 71 with the one having the first and second drive-side protrusions 711A, 712A formed at different locations.

Figure 17:
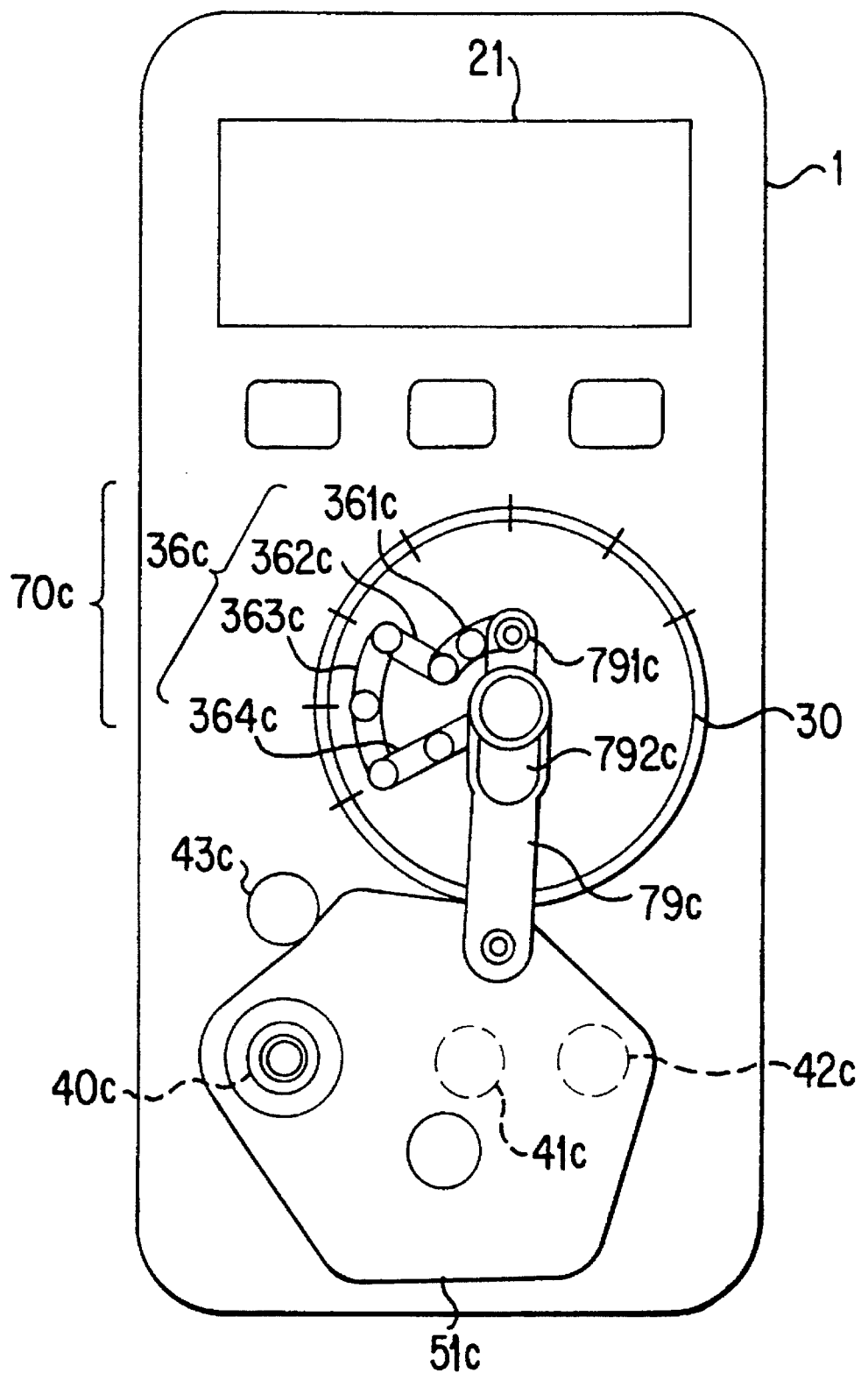
FIG. 17 is a schematic drawing showing a shutter board driving mechanism formed in a multimeter according to a fifth embodiment of the present invention.

A fifth embodiment of the present invention will now be described with reference to FIG. 17 showing the structure of the shutter board driving mechanism. In the fifth through seventh embodiments, the shutter board rotates about the center at the common terminal hole which is in the open state to enable multi-functionality and miniaturization of the shutter board driving mechanism while preventing the erroneous input of a pin plug.

The shutter board driving mechanism 70C provided in the rotary switch of this embodiment includes a guide groove 36C (cam groove) formed on the back side of the rotary switch 30 and a pin 791C (cam pin) protruding from the lever 79C which couples the rotary switch 30 with the shutter board 51C fitting inside the guide groove 36C. Since the rotation about the center axis of the rotary switch 30 is placed in the elongated hole 792C formed on the lever 79C, the lever 79C can rotate around the center axis and at the same time can slide in the radial direction of the rotary switch 30.

The guide groove 36C includes a first guide unit 361C extending along a circumference of the rotary switch 30 centering at the rotation center axis, a second guide unit 362C extending from an edge section of the first guide unit 361C towards the outer perimeter of the rotary switch 30, a third guide unit 363C extending from an edge section of the second guide unit 362C along the circumference direction and a fourth guide unit 364C extending from an edge section of the third guide unit 363C towards the center axis of the rotary switch 30. FIG. 17 shows a condition where a pin 791 is placed in the edge section of the first guide unit 361C. FIG. 17 also shows a locus of motion of the pin 791 in the lever 79 with each rotation of the rotary switch 30 by one step.

The shutter board 51 rotates about the center at the common terminal hole 40C. The edge section of the lever 79C is coupled to the section facing the shutter board 51. Hence, when the rotary switch 30 is rotated from the position shown in FIG. 17, the pin 791C moves inside the first, second, third and fourth guide units 361C–364C to rotate the shutter board 51C. Therefore, when the measurement mode and range is selected using the rotary switch 30, only the appropriate input terminal hole is in the open state based on the hole 512C or the side edge sections of the shutter board 51C. Thus, a pin plug is not accidentally plugged into other input terminal holes.

Moreover, the shutter board 51C rotates about a center at the negative common terminal hole 40C which is always in the open state. Therefore, it is not necessary to form a negative common terminal hole 40C outside the range of rotation of the shutter board 51C. Thus, the design freedom is increased by easing restrictions on the size and range of rotation of the shutter board 51C. Furthermore, miniaturization is achieved by saving space and not providing the common terminal hole outside the range of rotation.

Figure 18:
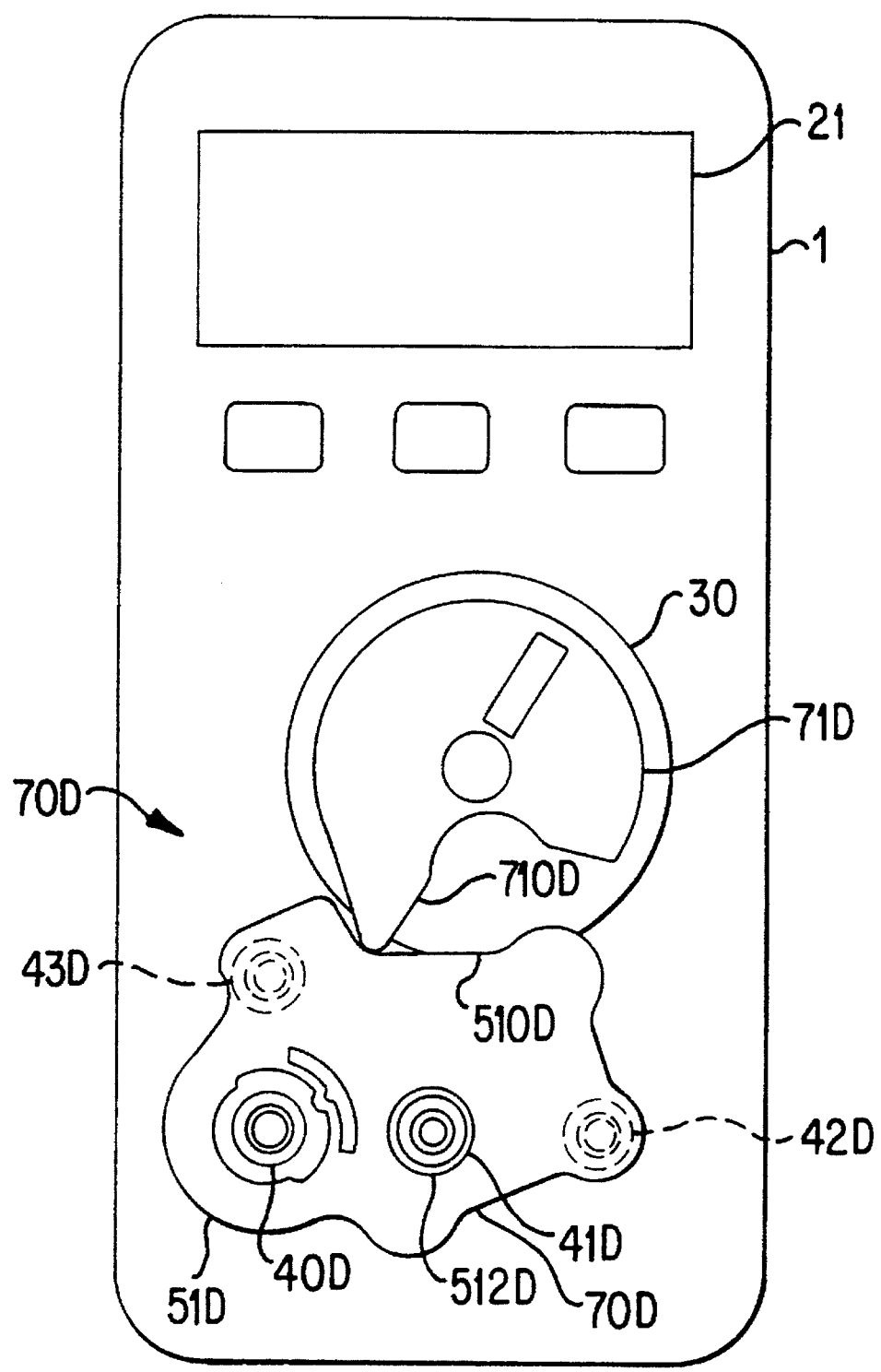
FIG. 18 is a schematic drawing showing a shutter board driving mechanism formed in a multimeter according to a sixth embodiment of the present invention.

A sixth embodiment of the present invention will now be described with reference to FIG. 18 showing the structure of a shutter board driving mechanism. The shutter board driving mechanism 70D in this embodiment includes a selector 71D that rotates with rotary switch 30 as one unit in the back side of the rotary switch 30. A portion of the outer perimeter of the selector 71D is formed into a cam 710D having a specific mountain-valley shape. The shutter board 51D rotates about a center at the common terminal hole 40D. A mountain-valley shape 510D, similar to the cam 710D for the selector 71D, is formed along the outer perimeter of the shutter board 51D to help rotate the shutter board 51D.

The shutter board 51D therefore rotates with the rotation of the selector 71D when the measurement mode or range is switched by the rotary switch 30. As a result, only an appropriate input terminal hole becomes the open state based on the hole 512D or the side edge section of the shutter board 51D.

The shutter board 51D rotates about the center at the negative common terminal hole 40D which is always in the open state. Hence the negative common terminal hole 40D need not be formed at a location outside the range of rotation of the shutter board 51D. Thus, the design freedom increases by easing restrictions on the size and range of rotation of the shutter board 51D. Furthermore, miniaturization of the multimeter is achieved by saving space and not providing the negative common terminal hole outside the range of rotation.

Figure 19:
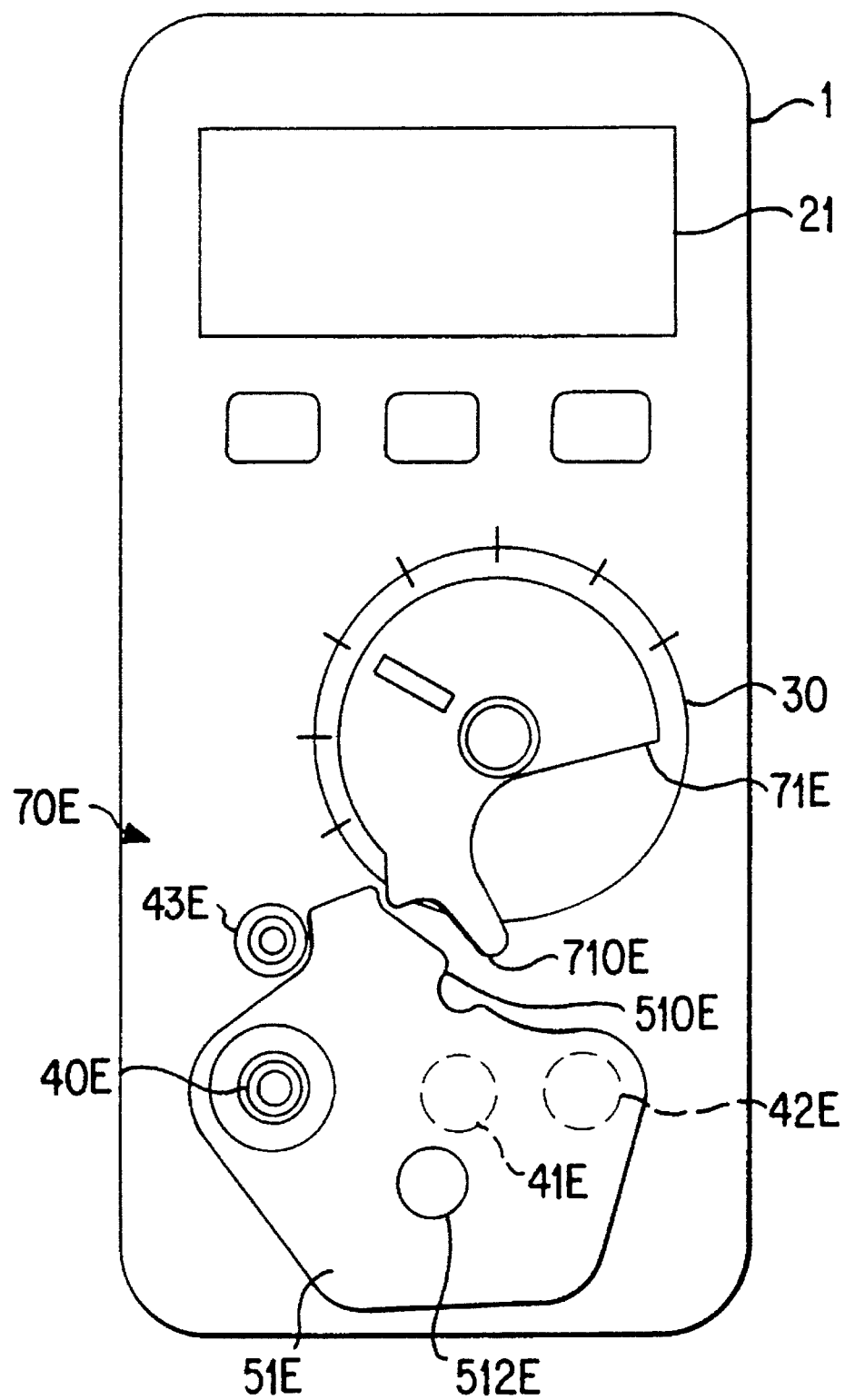
FIG. 19 is a schematic drawing showing a shutter board driving mechanism formed in a multimeter according to a seventh embodiment of the present invention.

A seventh embodiment of the present invention will now be described with respect to FIG. 19 showing a structure of the shutter board driving mechanism. The shutter board driving mechanism 70E includes a selector 71E on the back side of the rotary switch 30 which rotates with the rotary switch 30 as one unit. A portion of the outer perimeter of the selector 71E is formed into a cam 710E having a specific mountain-valley shape. The shutter board 51E rotates about a center at the common terminal hole 40D. A mountain-valley shape 510E, similar to the cam 710E for the selector 71E, is formed along the outer perimeter of the shutter board 51E to help rotate the shutter board 51E.

The shutter board 51E rotates with the rotation of the selector 71E when the measurement mode or range is switched using the rotary switch 30. As a result, only an appropriate input terminal hole becomes the open state from the hole 512E or the side edge section of the shutter board 51E.

Moreover, the shutter board 51E rotates about the center at the negative common terminal hole 40E which is always in the open state. Hence the negative common terminal hole 40E is not formed at a location outside the range of rotation of the shutter board 51E. Hence, design freedom increases by easing restrictions on the size and range of rotation of the shutter board 51E. Furthermore, miniaturization of the multimeter is achieved by saving space and not providing the negative common terminal hole outside of range of rotation.

In the above described embodiments, the common terminal hole is described as being used as a negative terminal. However, one skilled in the art would appreciate that the common terminal hole can also be used as a positive terminal.

As described above, when the measurement mode or range is switched by rotating the rotary switch 30, only an appropriate input terminal hole is made to be in the open state to prevent a pin plug of a test lead from being accidentally plugged into other input terminal holes.

Moreover, with the rotation of the rotary switch, the shutter board becomes mechanically connected to the rotary switch, the connection becomes interrupted and again becomes mechanically connected to the rotary switch. Thus, more than one mode can be assigned to the input terminal hole located at the central section to result in greater design freedom.

If the rotation of the rotary switch is transmitted to the shutter board by at least two drive-side protrusions which rotate with the rotary switch as one unit, the same selection terminal hole remains in the open state as long as the drive-side protrusions do not operate even when the rotary switch rotates. Thus, a complex mechanism is not needed to have a multimeter in which one selection terminal hole has more than one function. In such a case, if drive-side protrusions are formed in a selector member freely interchangeable on the rotary switch, the corresponding relationship between the operation of the rotary switch and the opening and closing operation of the selection terminal hole by the shutter board can change by replacing the selector member with one having drive-side protrusions at different positions.

If the shutter board rotates about the center where the common terminal hole is formed, the shutter board also rotates about the center at a common terminal hole which is left in the open state. Hence, the common terminal hole is not needed to be formed outside the range of rotation of the shutter board. This increases the design freedom by easing restrictions on the size and range of rotation of the shutter board. Furthermore, miniaturization by an amount equivalent to placing the common terminal hole within the range of rotation is achieved.

In the present invention, if one of the plurality of selection terminal holes is made to be in the open state by protruding from the side edge section of the shutter board, the selection terminal holes can be placed at an arbitrary radial distance from the center of rotation of the shutter board as long as the side edge section of the shutter board appears and disappears at that position. Hence design freedom is increased based on the location of selection terminal holes to improve the usability and the design characteristics.

While the present invention has been described with reference to preferred embodiments, one skilled in the art would appreciate that other modifications and variations are within the scope of the invention as defined by the following claims.

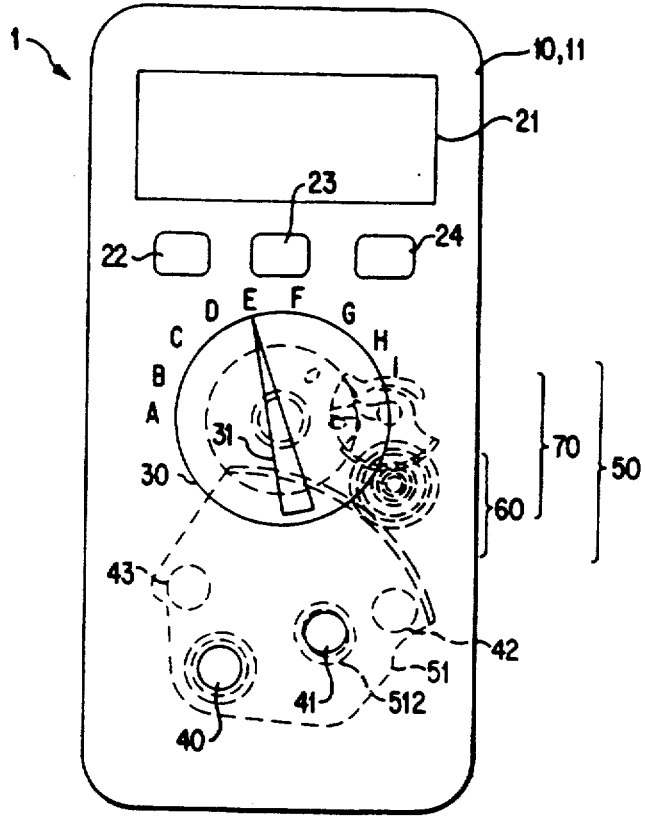

What is claimed is:

1. A multimeter having an erroneous input prevention mechanism comprising:

a rotary switch to select measuring functions, a common terminal hole that receives a test lead pin plug, a plurality of selection holes separate from the common terminal holes, a shutter board that rotates based on operation of the rotary switch to maintain the common terminal hole in an open state and open one of the selection holes while interrupting the other selection holes, and a shutter board driving mechanism that rotates the shutter board by transmitting rotational motion from the rotary switch to the shutter board, the shutter board driving mechanism including at least two connection positions within a range of rotation of the rotary switch to mechanically connect the shutter board and the rotary switch and thereby cause the shutter board to rotate based on rotation for the rotary switch, the shutter board driving mechanism further including interrupting positions between the connection positions to interrupt the mechanical connection of the shutter board and rotary switch and prevent movement of the shutter board regardless of the rotation of the rotary switch.

2. The multimeter having the erroneous input prevention mechanism of claim 1, wherein the shutter board driving mechanism includes at least two drive-side protrusions separated by a predetermined angle to transmit rotational operation of the rotary switch to the shutter board by rotating with the rotary switch as one unit, wherein the connection positions and the interrupting position are determined by the positions of the drive-side protrusions.

3. The multimeter having the erroneous input prevention mechanism of claim 2, wherein the shutter board driving mechanism includes a slave member having a slave-side protrusion that receives rotational driving power from the drive-side protrusions and transmits the rotational driving power to the shutter board through the slave-side protrusion.

4. The multimeter having the erroneous input prevention mechanism of claim 2, wherein the drive-side protrusion is formed on an interchangeable selector member freely interchangeable on the rotary switch.

5. The multimeter having the erroneous input prevention mechanism of claim 1, wherein the shutter board rotates about an axis provided at a position of the common terminal hole.

6. The multimeter having the erroneous input prevention mechanism of claim 1, wherein the plurality of selection holes include a first selection terminal hole and a second selection terminal hole, the first and second selection terminal hole being formed at two locations in a substantially same angular direction from the common terminal hole and spaced at different radial distances from the common terminal hole, the first selection terminal hole becoming an open state when matched with a corresponding hole on the shutter board, the second selection terminal hole becoming an interruption state by being covered by a side edge of the shutter board and being the open state by protruding out from the side edge.

7. The multimeter having the erroneous input prevention mechanism of claim 6, wherein the plurality of selection holes further includes a third selection terminal hole formed at a location in a substantially different angular direction from the common terminal hole as the first and second selection terminal holes, the third selection terminal hole being in the interruption state when covered by another side edge of the shutter board and being in the open state by protruding out from the other side edge.

8. The multimeter having the erroneous input prevention mechanism of claim 1, wherein the shutter board driving mechanism includes a cam groove and a cam pin protruding from a lever, wherein the cam pin moves inside the cam groove to rotate the shutter board.

9. The multimeter having the erroneous input prevent mechanism of claim 1, wherein the shutter board driving mechanism includes a selector that rotates with the rotary switch, the selector including a cam having a mountain-valley shape to engage with a mountain-valley shaped portion of the shutter board.

10. A multimeter having an erroneous input prevention mechanism comprising:

a rotary switch to select measuring functions, a common terminal hole to receive a test lead pin plug, a plurality of selection holes separate from the common terminal holes, a shutter board that rotates based on rotation operation of the rotary switch, the shutter board maintaining the common terminal hole in an open state and further opening one of the selection terminal holes while interrupting other ones of the selection holes, and a shutter board driving mechanism to drive the rotation of the shutter board by transmitting rotational motion of the rotary switch to the shutter board, the shutter board rotating about an axis at a position of the common terminal hole.

11. The multimeter having the erroneous input prevention mechanism of claim 10, wherein the shutter board driving mechanism includes at least two drive-side protrusions separated by a predetermined angle to transmit rotational operation of the rotary switch to the shutter board by rotating with the rotary switch as one unit, wherein the connection positions and the interrupting position are determined by the positions of the drive-side protrusions.

12. The multimeter having the erroneous input prevention mechanism of claim 11, wherein the shutter board driving mechanism includes a slave member having a slave-side protrusion that receives rotational driving power from the drive-side protrusions and transmits the rotational driving power to the shutter board through the slave-side protrusion.

13. The multimeter having the erroneous input prevention mechanism of claim 11, wherein the drive-side protrusion is formed on an interchangeable selector member freely interchangeable on the rotary switch.

14. The multimeter having the erroneous input prevention mechanism of claim 10, wherein the shutter board rotates about an axis provided at a position of the common terminal hole.

15. The multimeter having the erroneous input prevention mechanism of claim 10, wherein the plurality of selection holes include a first selection terminal hole and a second selection terminal hole, the first and second selection terminal holes being formed at two locations in a substantially same angular direction from the common terminal hole and spaced at different radial distances from the common terminal hole, the first selection terminal hole becoming an open state when matched with a corresponding hole on m the shutter board, the second selection terminal hole becoming an interruption state by being covered by a side edge of the shutter board and being the open state by protruding out from the side edge.

16. The multimeter having the erroneous input prevention mechanism of claim 15, wherein the plurality of selection holes further includes a third selection terminal hole formed at a location in a substantially different angular direction from the common terminal hole as the first and second selection terminal holes, the third selection terminal hole being in the interruption state when covered by another side edge of the shutter board and being in the open state by protruding out from the other side edge.

17. The multimeter having the erroneous input prevention mechanism of claim 10, wherein the shutter board driving mechanism includes a cam groove and a cam pin protruding from a lever, wherein the cam pin moves inside the cam groove to rotate the shutter board.

18. The multimeter having the erroneous input prevent mechanism of claim 10, wherein the shutter board driving mechanism includes a selector that rotates with the rotary switch, the selector including a cam having a mountain-valley shape to engage with a mountain-valley shaped portion of the shutter board.

19. A multimeter having an erroneous input prevention mechanism comprising:

a rotary switch that selects among different functions;

a common terminal hole that receives a test lead pin plug;

a plurality of selection terminal holes that receive another test lead pin plug;

a shutter board having a first hole corresponding to the common terminal hole and a second hole between first and second edges, the shutter board rotating about the common terminal hole to maintain the common terminal hole in an open state and selectively opening one of the selection terminal holes into an open state while causing other selection terminal holes to be in an interruption state; and shutter board driving means for rotating the shutter board based on movement of the rotary switch.

20. The multimeter having the erroneous prevention mechanism of claim 19, wherein the shutter board driving means includes protrusions for transmitting the movement of the rotary switch to the shutter board.

* * * * *

UNITED STATES PATENT AND TRADEMARK OFFICE
CERTIFICATE OF CORRECTION

Figure 20:
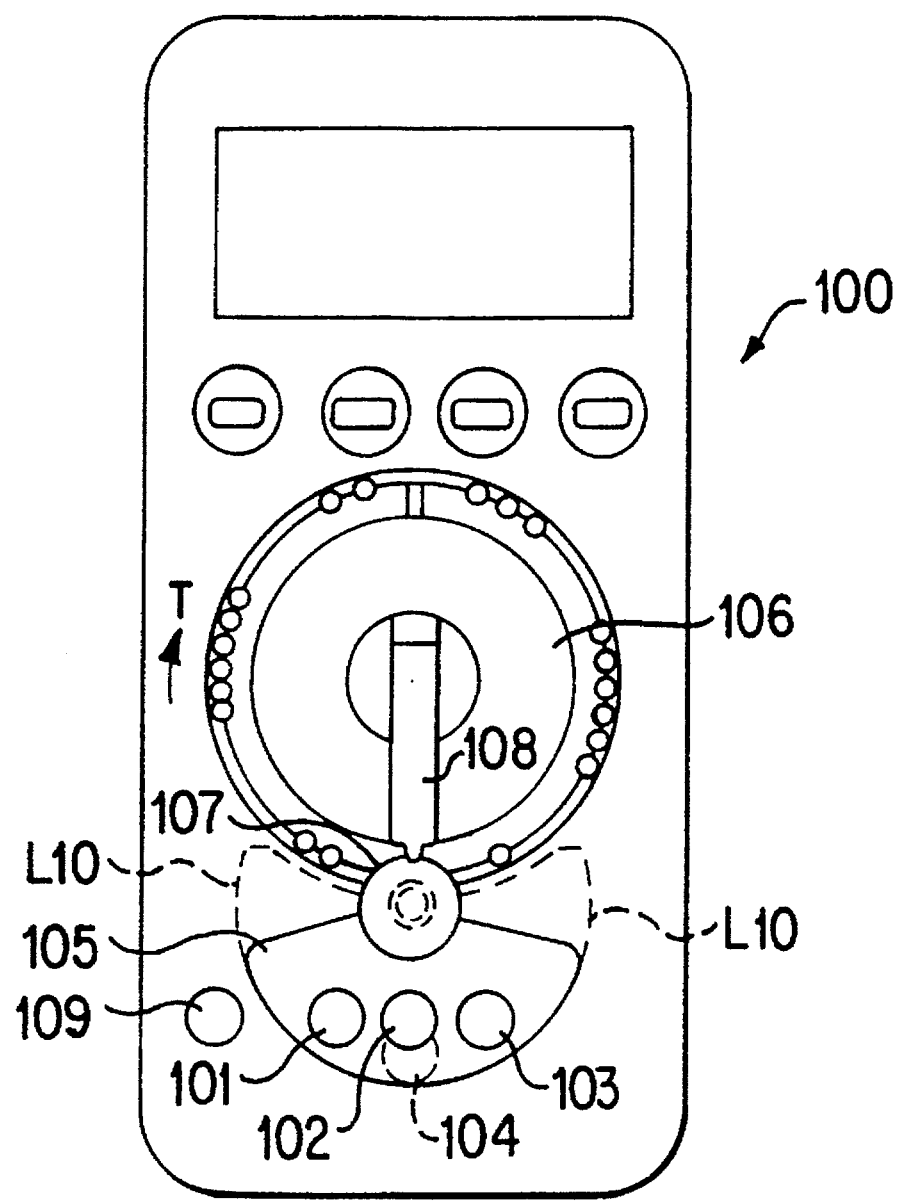
FIG. 20 is a drawing showing a erroneous input prevention mechanism in a conventional multimeter.

PATENT NO. : 5,619,129　　　　　　　　　　　　　　　　　　Page 1 of 2
DATED　　　 : April 8, 1997
INVENTOR(S) : Manabu KAMIYA It is certified that error appears in the above-indentified patent and that said Letters Patent is hereby corrected as shown below:

Please substitute Fig. 1 on the cover page for Fig. 20.

Signed and Sealed this

Seventeenth Day of February, 1998

Attest:

BRUCE LEHMAN

Attesting Officer　　　　　Commissioner of Patents and Trademarks

United States Patent

Kamiya

Patent Number: 5,619,129
Date of Patent: Apr. 8, 1997

[54] MULTIMETER HAVING AN ERRONEOUS INPUT PREVENTION MECHANISM

[75] Inventor: Manabu Kamiya, Suwa, Japan

[73] Assignee: Seiko Epson Corporation, Tokyo, Japan

[21] Appl. No.: 588,377

[22] Filed: Jan. 18, 1996

[30] Foreign Application Priority Data

Jan. 19, 1995 [JP] Japan ..................... 7-006672
Dec. 18, 1995 [JP] Japan ..................... 7-329347

[51] Int. Cl.$^6$ .......................... G08B 21/00; G01R 23/16; G01R 15/12; G01R 1/00
[52] U.S. Cl. .................. 324/115; 324/76.11; 324/110
[58] Field of Search ...................... 324/115, 110, 324/76.11; 340/635, 686, 687, 693

[56] References Cited

U.S. PATENT DOCUMENTS

| | | | |
|---|---|---|---|
| 5,166,599 | 11/1992 | Hochreuther et al. | 324/115 |
| 5,243,275 | 9/1993 | Nakazawa et al. | 324/110 |
| 5,442,337 | 8/1995 | Hwang | 324/115 |

FOREIGN PATENT DOCUMENTS

| | | |
|---|---|---|
| 474086A2 | 3/1992 | European Pat. Off. |
| 507126A2 | 10/1992 | European Pat. Off. |
| 62-39333 | 10/1987 | Japan |
| 4-233473 | 8/1992 | Japan |
| 4-118669 | 10/1992 | Japan |
| 6-21024 | 6/1994 | Japan |

Primary Examiner—Ernest F. Karlsen
Assistant Examiner—Barry C. Bowser
Attorney, Agent, or Firm—Oliff & Berridge

[57] ABSTRACT

A multimeter is provided having an erroneous input prevention mechanism that allows more than one mode to be assigned to an input terminal hole located in a central section of a shutter board based on movement of a rotary switch. When the rotary switch is rotated, the first and the second drive-side protrusions formed at separate locations from the selector push away the first or second slave-side protrusions in the slave shell to rotate the shutter board about the center at the negative common terminal hole. Thus, only a specific terminal hole is in the open state. Even when the rotary switch is rotated to a predetermined position, the shutter board does not rotate to leaving the first input terminal hole in the open state.

20 Claims, 17 Drawing Sheets